United States Patent
Jung et al.

(10) Patent No.: US 11,152,599 B2
(45) Date of Patent: Oct. 19, 2021

(54) OPTICAL FILTER FOR ANTI-REFLECTION AND ORGANIC LIGHT-EMITTING DEVICE

(71) Applicant: LG CHEM, LTD., Seoul (KR)

(72) Inventors: Jong Hyun Jung, Daejeon (KR); Sergey Belyaev, Daejeon (KR); Sun Kug Kim, Daejeon (KR); Moon Soo Park, Daejeon (KR); Hyuk Yoon, Daejeon (KR)

(73) Assignee: LG CHEM, LTD., Seoul (KR)

(*) Notice: Subject to any disclaimer, the term of this patent is extended or adjusted under 35 U.S.C. 154(b) by 310 days.

(21) Appl. No.: 16/332,202

(22) PCT Filed: Oct. 24, 2017

(86) PCT No.: PCT/KR2017/011774
§ 371 (c)(1),
(2) Date: Mar. 11, 2019

(87) PCT Pub. No.: WO2018/080138
PCT Pub. Date: May 3, 2018

(65) Prior Publication Data
US 2019/0237515 A1    Aug. 1, 2019

(30) Foreign Application Priority Data
Oct. 24, 2016  (KR) .................. 10-2016-0138286

(51) Int. Cl.
| | | |
|---|---|---|
| H01L 51/52 | (2006.01) | |
| G02B 5/20 | (2006.01) | |
| G02B 1/11 | (2015.01) | |
| G02B 5/30 | (2006.01) | |

(52) U.S. Cl.
CPC ............ *H01L 51/5281* (2013.01); *G02B 1/11* (2013.01); *G02B 5/20* (2013.01); *G02B 5/30* (2013.01); *G02B 5/3025* (2013.01)

(58) Field of Classification Search
None
See application file for complete search history.

(56) References Cited

U.S. PATENT DOCUMENTS

| | | | |
|---|---|---|---|
| 8,154,694 | B2 | 4/2012 | Bitou et al. |
| 8,531,765 | B2 | 9/2013 | Sakai et al. |
| 2006/0209239 | A1 | 9/2006 | Lin |
| 2010/0149637 | A1 | 6/2010 | Kwon et al. |
| 2011/0222155 | A1 | 9/2011 | Sakai et al. |
| 2013/0163081 | A1 | 6/2013 | Cho et al. |
| 2015/0070764 | A1 | 3/2015 | Hatanaka et al. |
| 2017/0052300 | A1 | 2/2017 | Takeda et al. |

FOREIGN PATENT DOCUMENTS

| | | | |
|---|---|---|---|
| JP | 2002-116435 A | | 4/2002 |
| JP | 2006-259694 A | | 9/2006 |
| JP | 2007-79201 A | | 3/2007 |
| JP | 2007-286141 A | | 11/2007 |
| JP | 2007-334085 A | | 12/2007 |

(Continued)

*Primary Examiner* — Derek S. Chapel
(74) *Attorney, Agent, or Firm* — Dentons US LLP

(57) ABSTRACT

The present application relates to an optical filter and an organic light-emitting display device. The optical filter of the present application has excellent omnidirectional anti-reflection performance and color characteristics on the side as well as the front, and the optical filter can be applied to an organic light-emitting device to improve visibility.

13 Claims, 24 Drawing Sheets

(56) References Cited

FOREIGN PATENT DOCUMENTS

| | | |
|---|---|---|
| JP | 2008-165185 A | 7/2008 |
| JP | 2009-186659 A | 8/2009 |
| JP | 2012-32418 A | 2/2012 |
| JP | 2015-079230 A | 4/2015 |
| JP | 2015079230 A | 4/2015 |
| KR | 10-2009-0122138 A1 | 11/2009 |
| KR | 10-2013-0036918 A | 4/2013 |
| KR | 10-2013-0066305 A | 6/2013 |
| KR | 10-2013-0128812 A | 11/2013 |
| KR | 10-2014-0083647 A | 7/2014 |
| KR | 10-2014-0094391 A | 7/2014 |
| KR | 10-2014-0118595 A1 | 10/2014 |
| KR | 10-2015-0057290 A1 | 5/2015 |
| TW | 2012-48219 A1 | 3/2012 |
| TW | 201239421 A1 | 10/2012 |
| TW | 2016-04595 A | 2/2016 |
| WO | 2010/058633 A1 | 5/2010 |
| WO | 2015/166930 A1 | 11/2015 |
| WO | 2016/158300 A1 | 10/2016 |
| WO | 2017110631 A1 | 6/2017 |

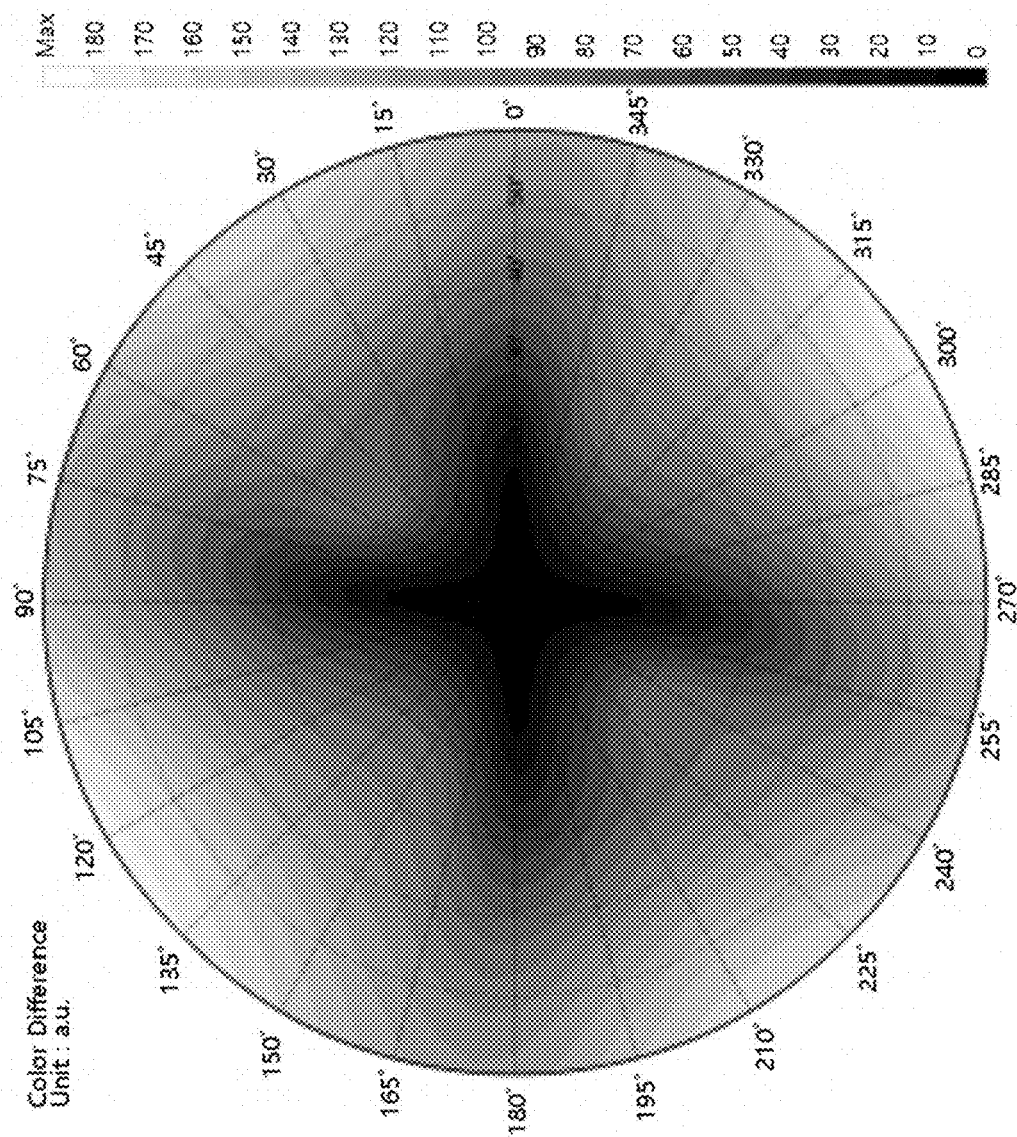
<Figure 3>

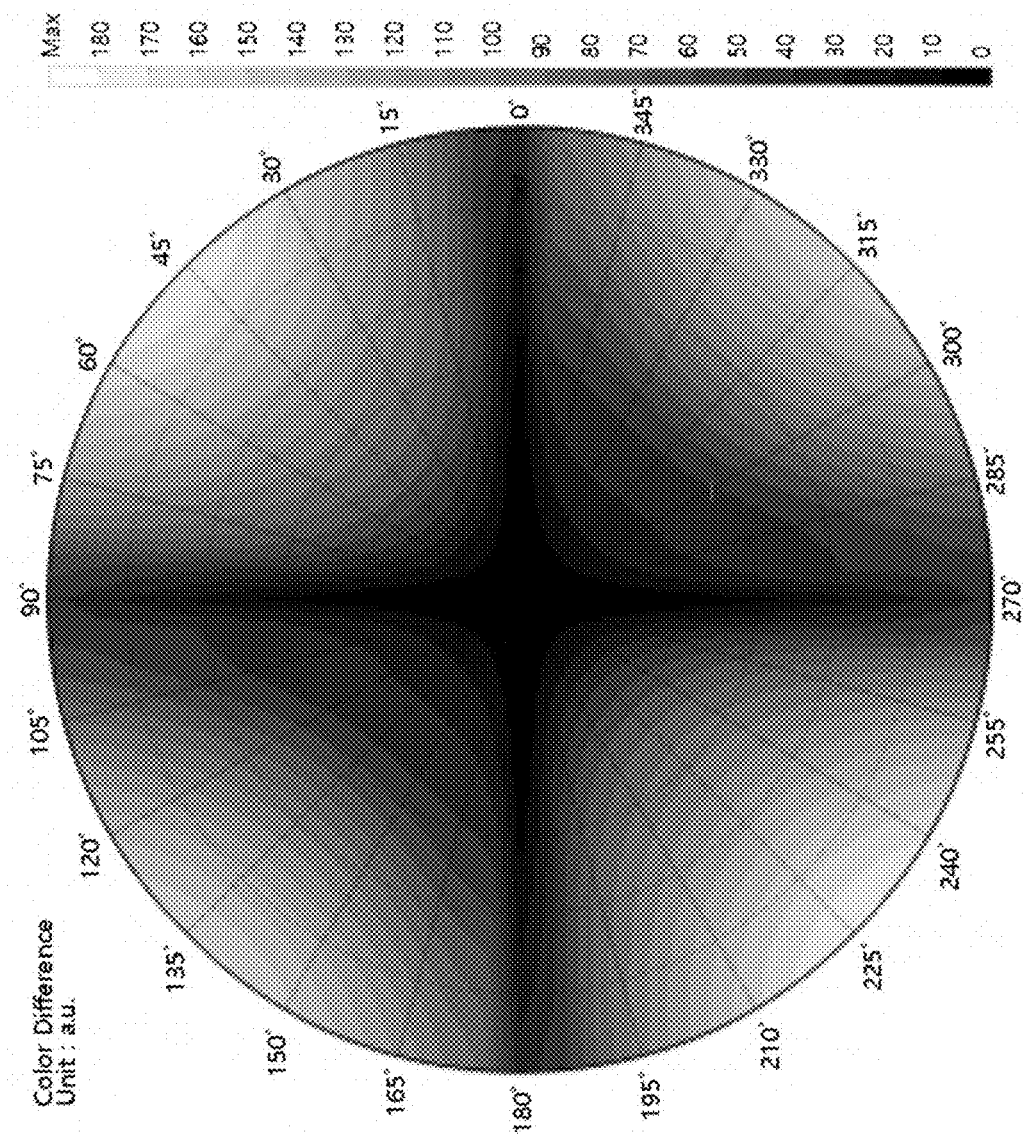
<Fig4 1-1>

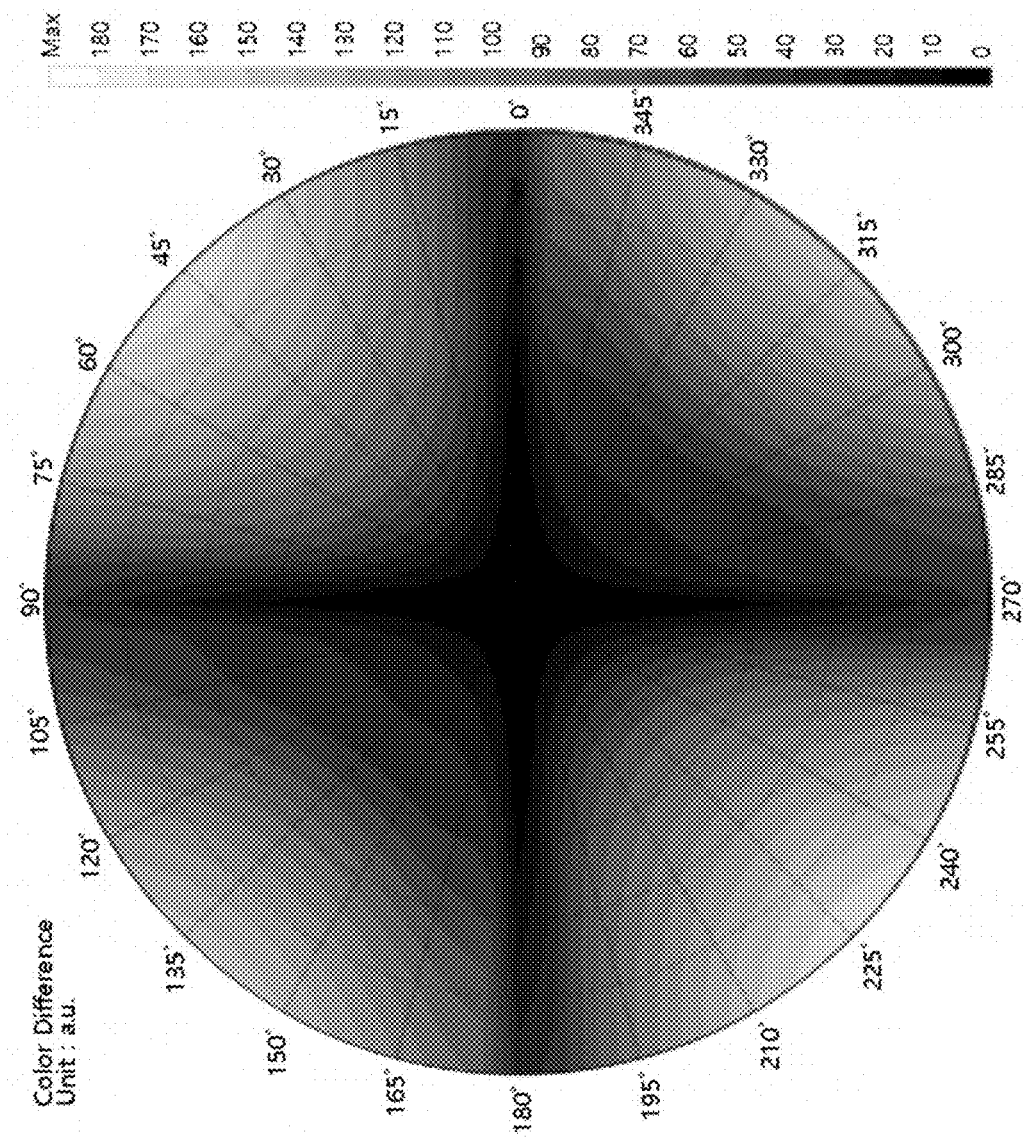
<Fig4 1-2>

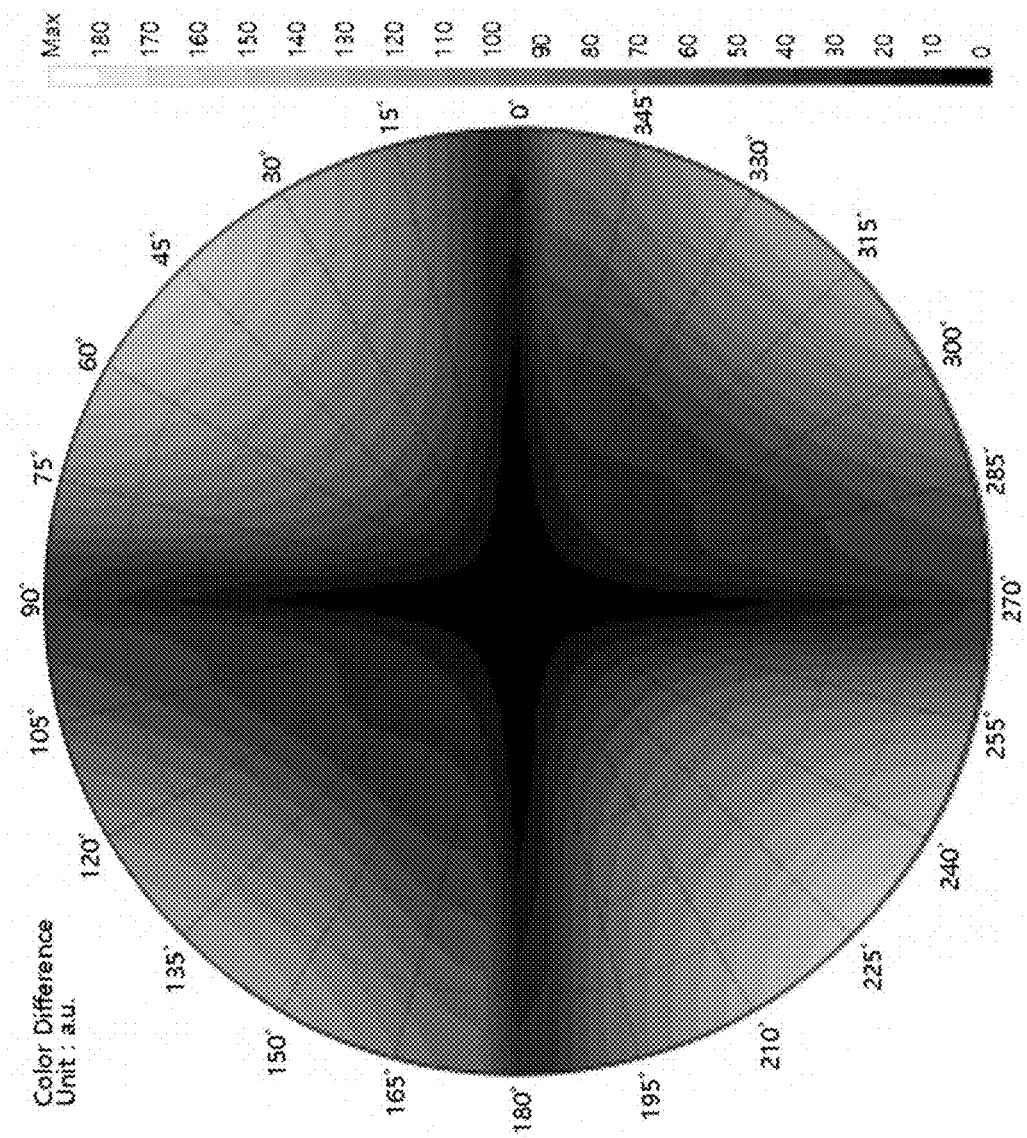
<Fig4 1-3>

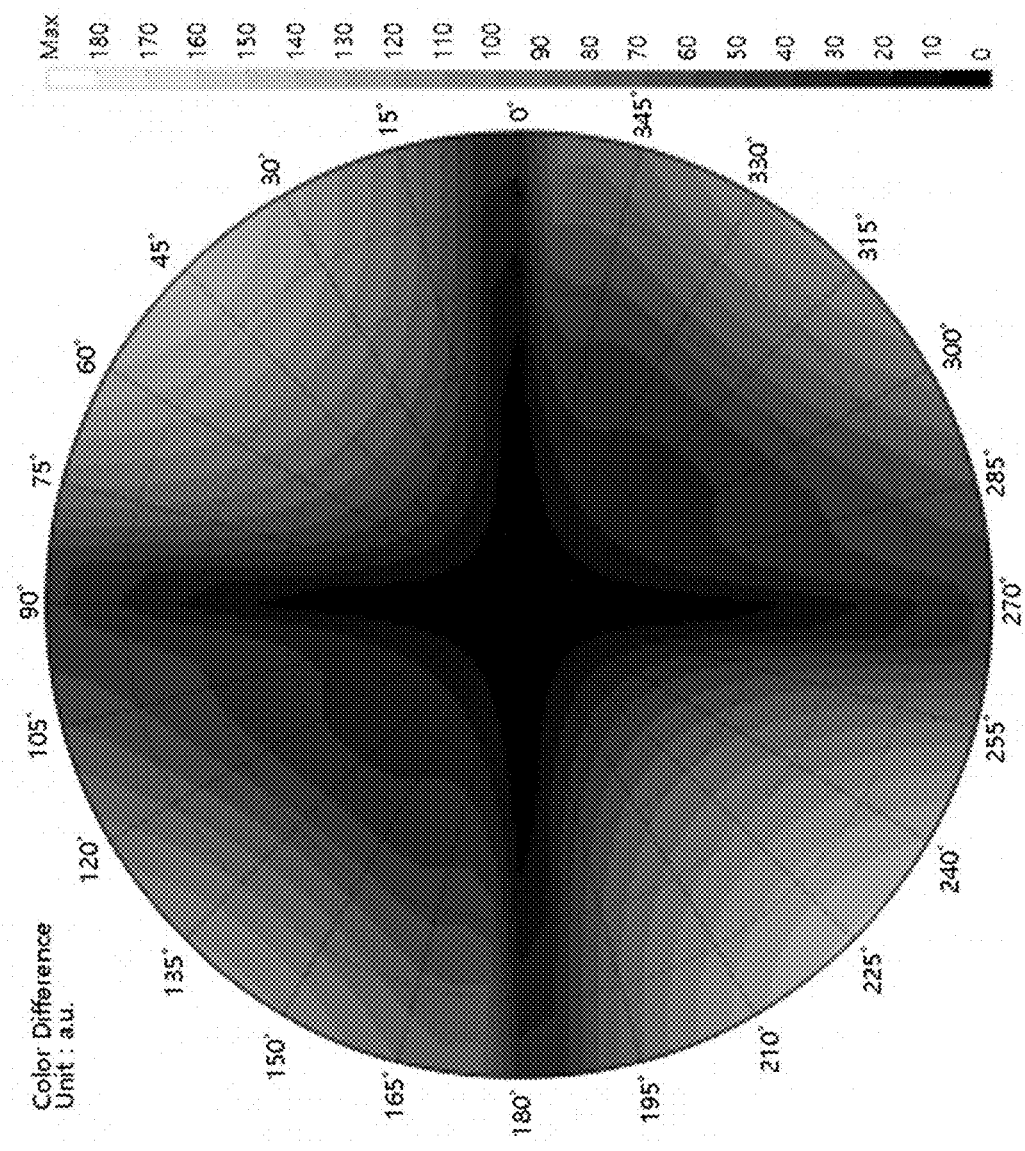
<Fig4 1-4>

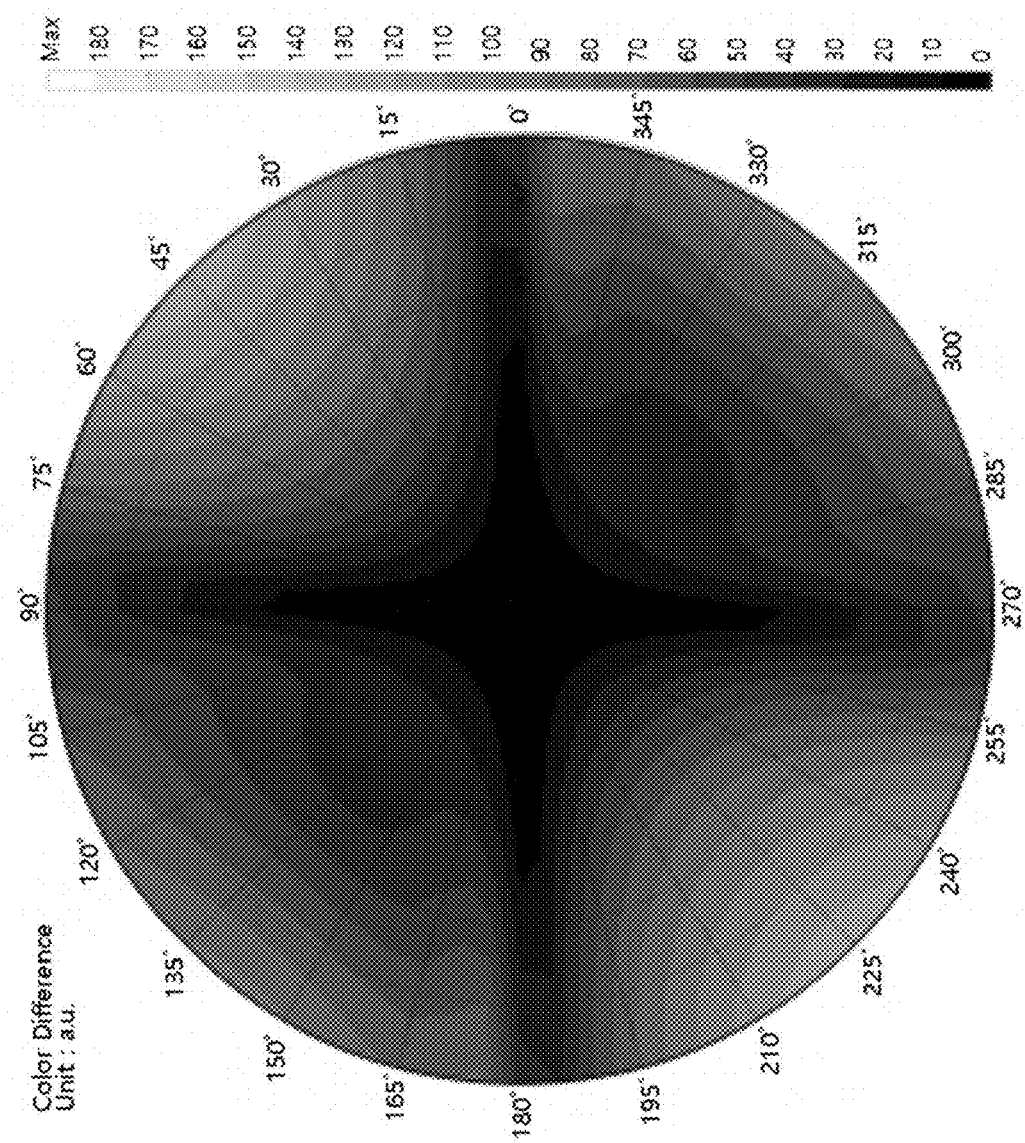
<Fig4 1-5>

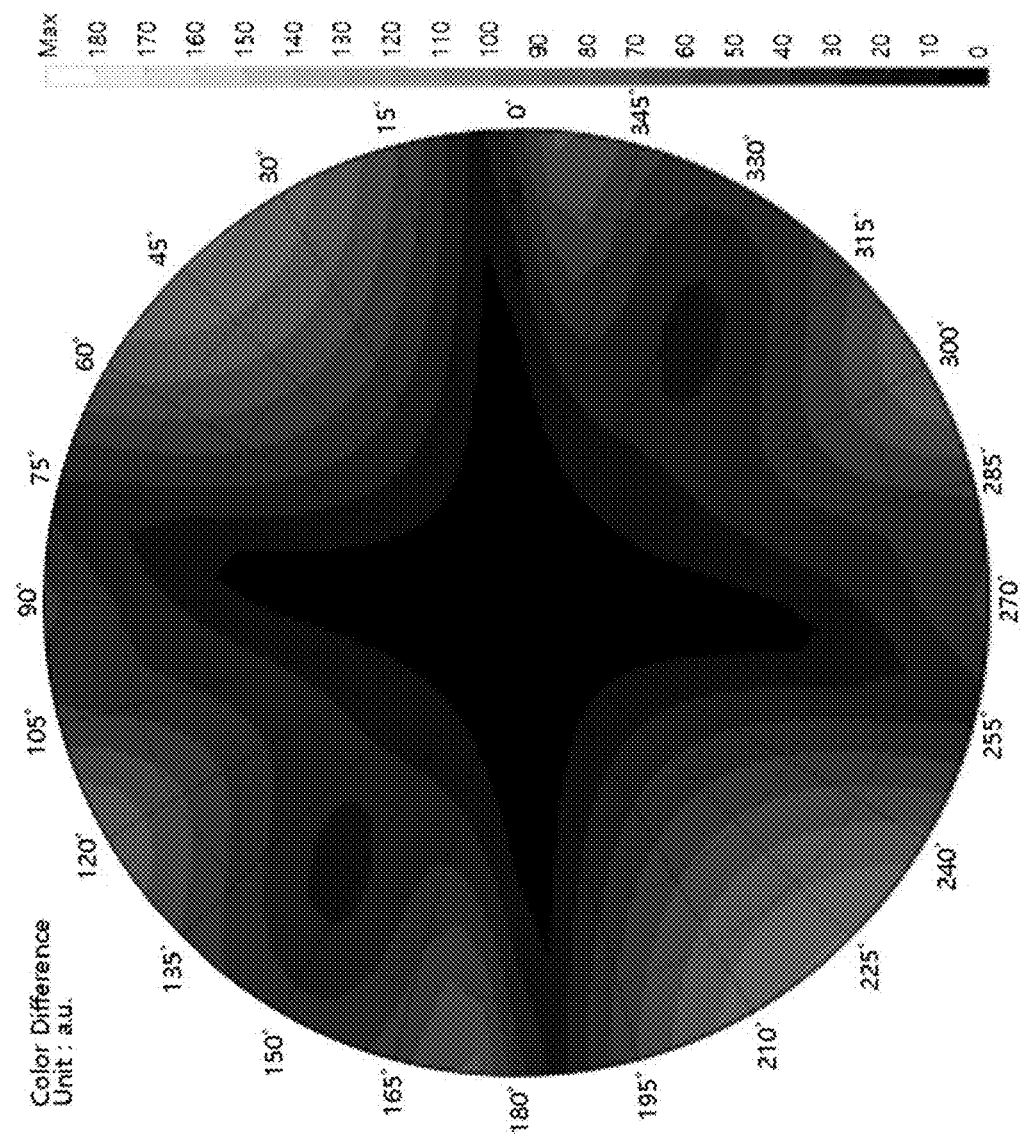
<Fig4 1-6>

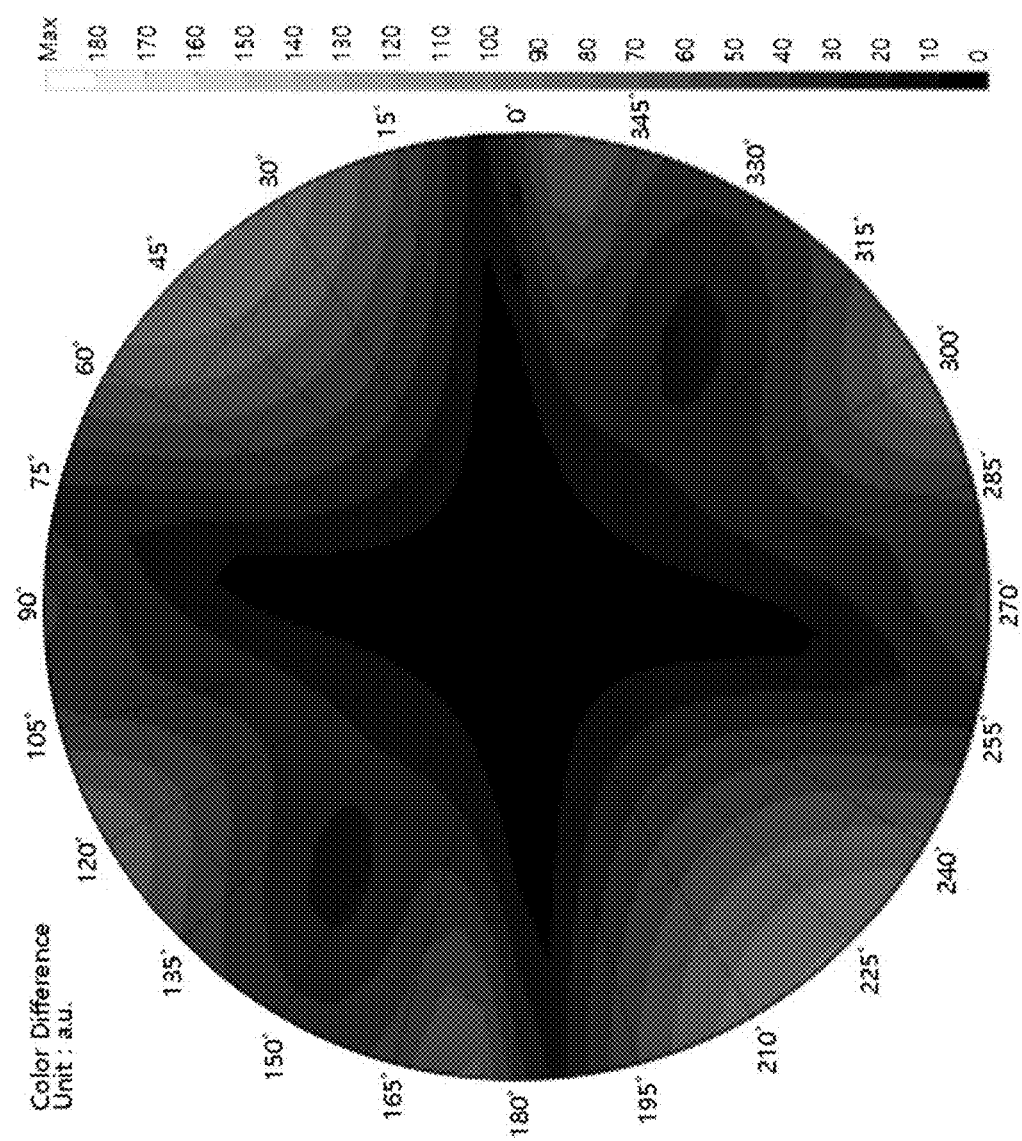
<Fig4 1-7>

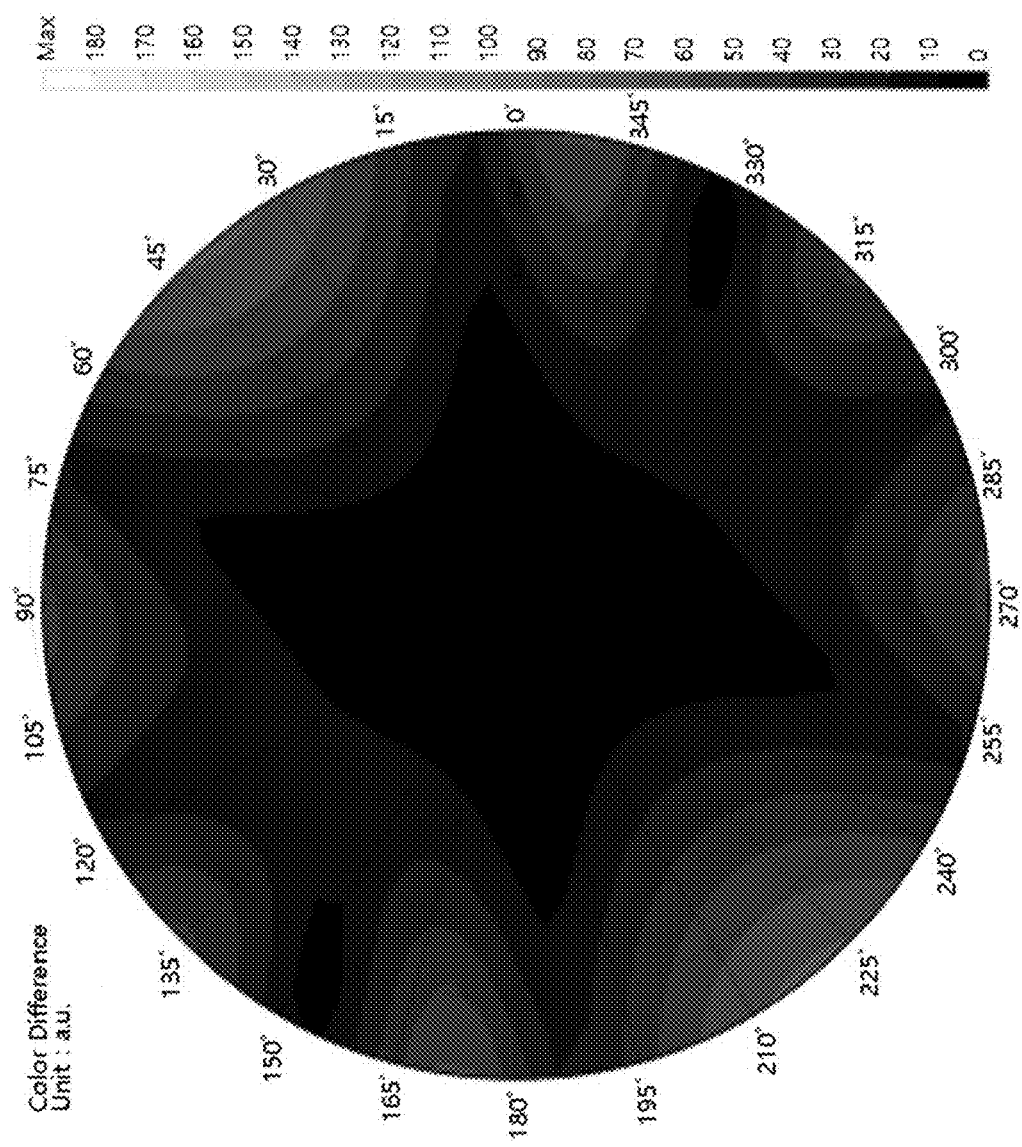
<Fig4 1-8>

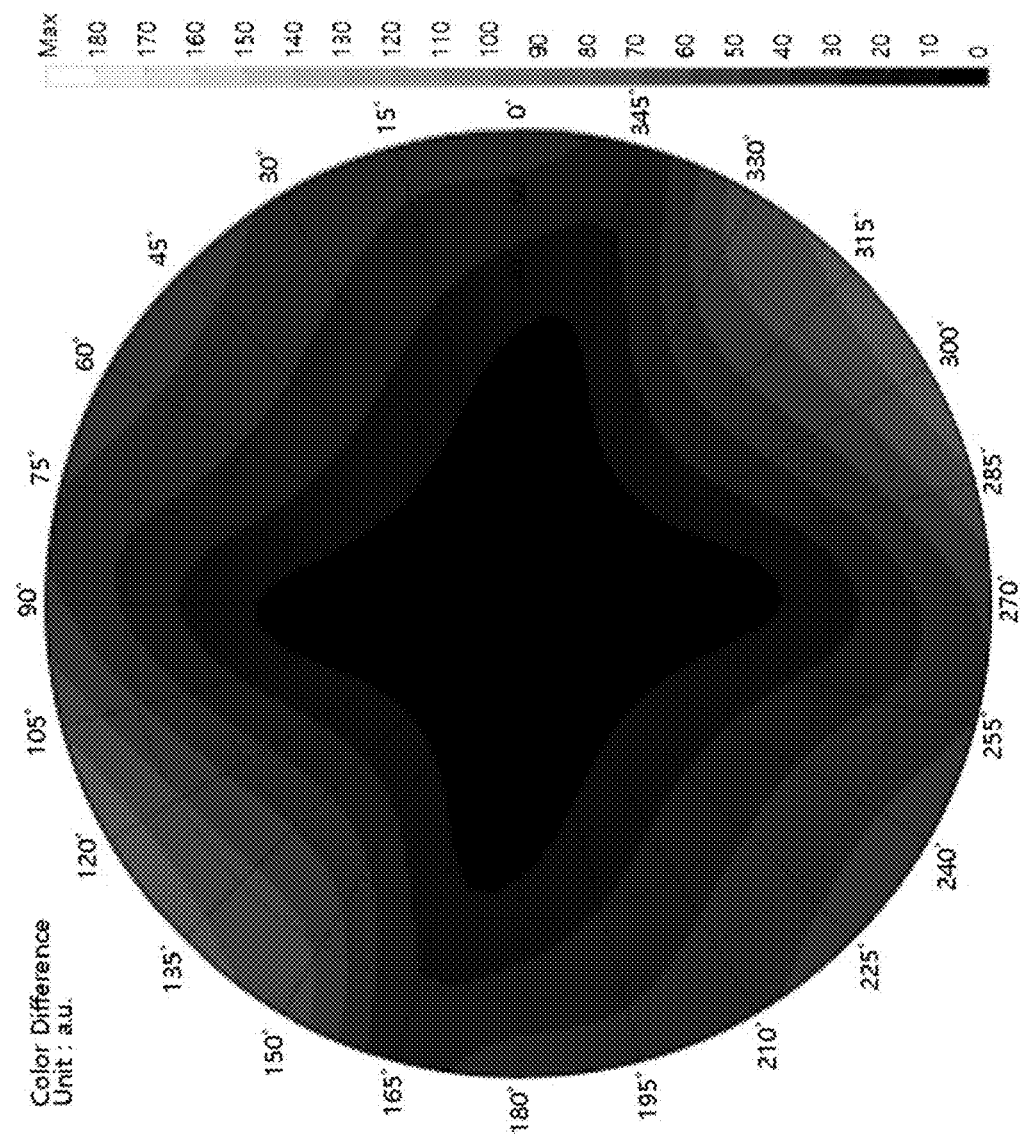
<Fig4 1-9>

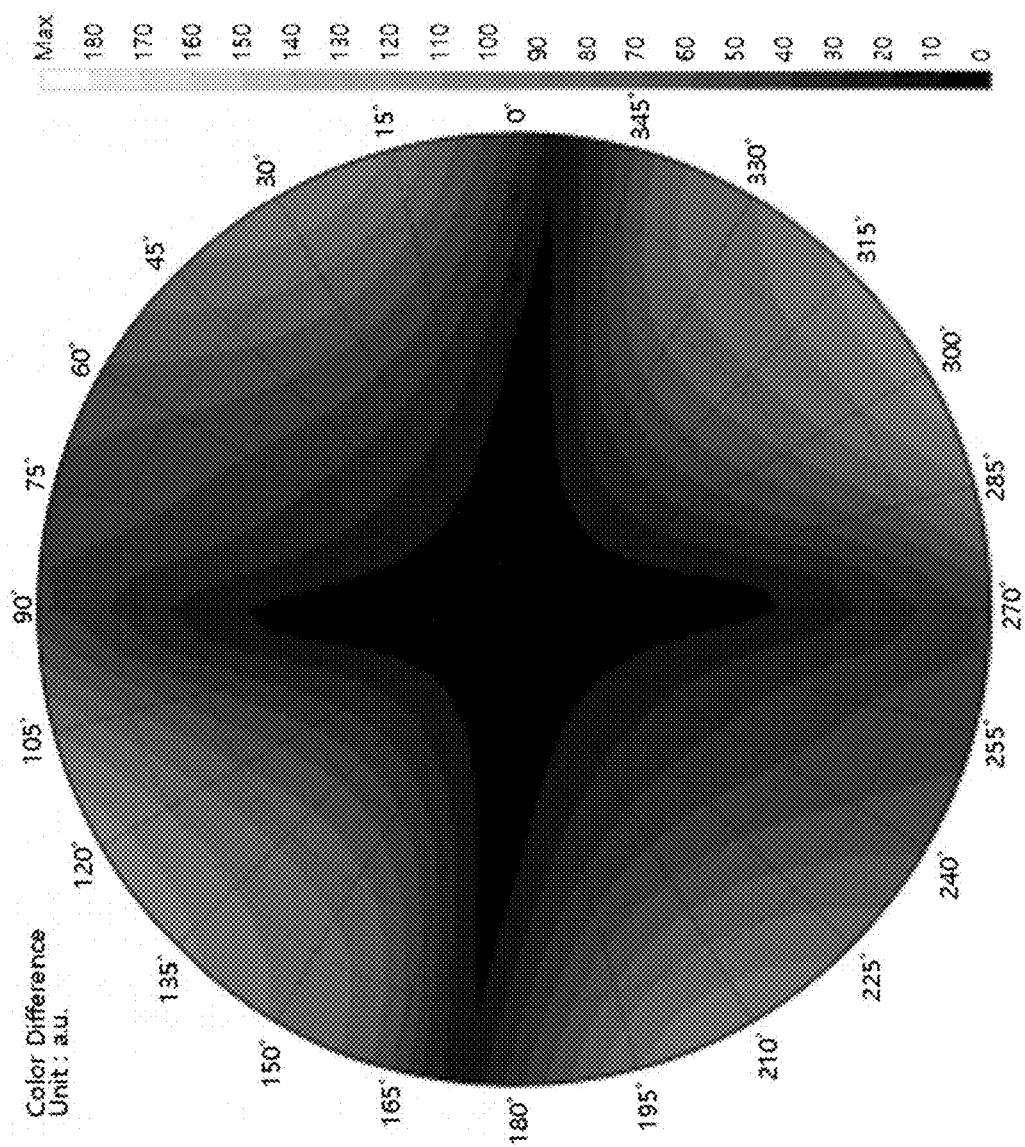
<Fig4 1-10>

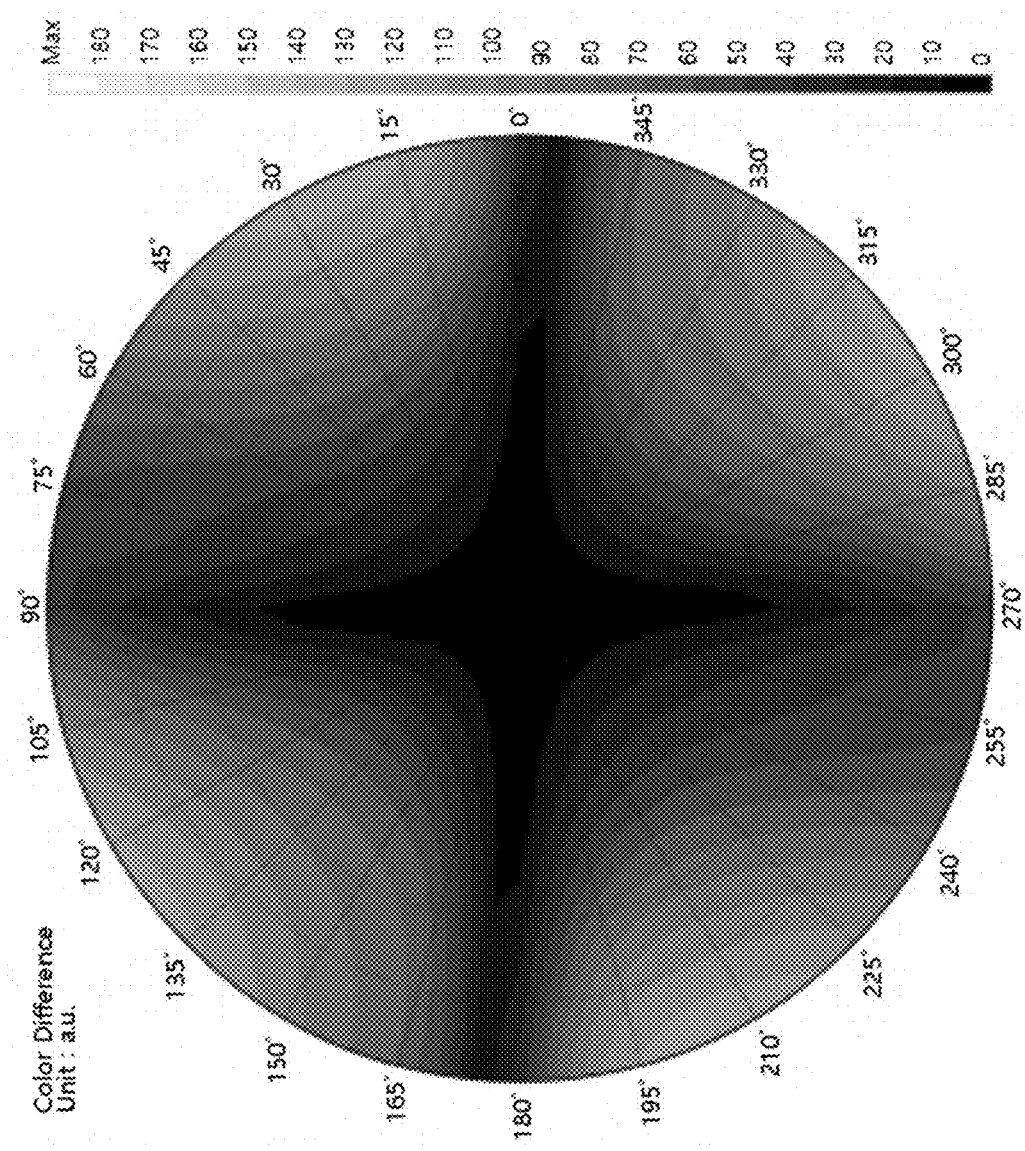
<Fig4 1-11>

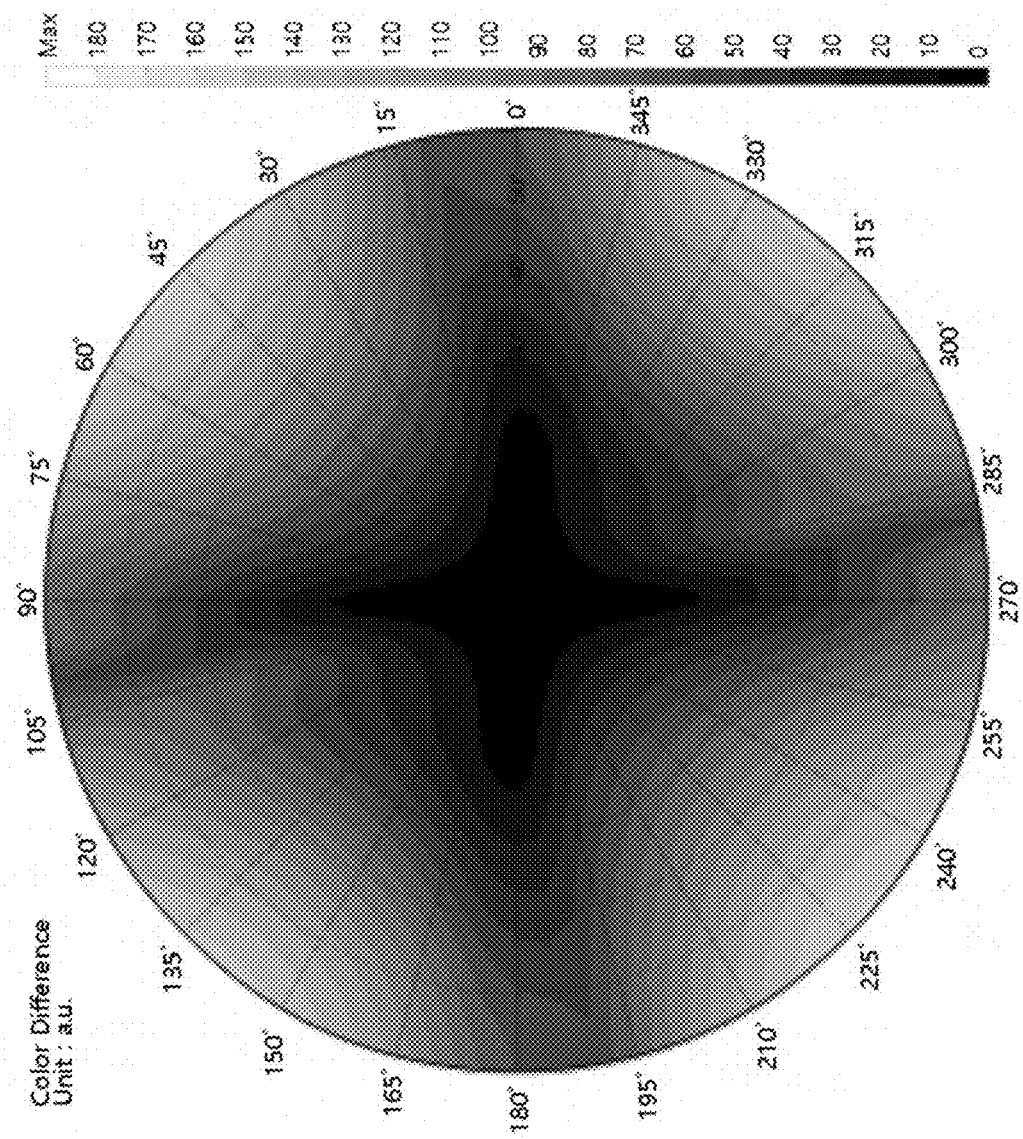
<Fig5 2-1>

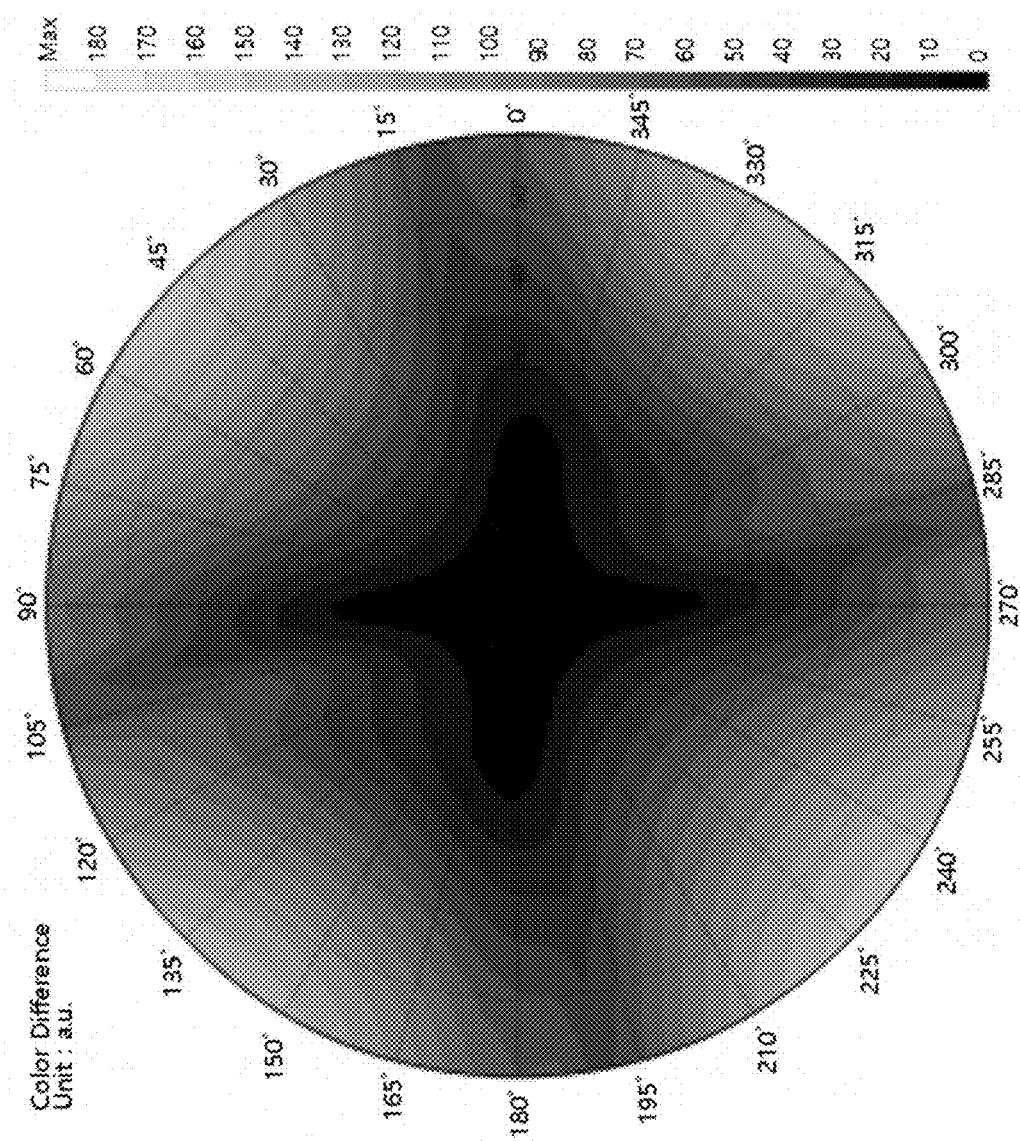
<Fig5 2-2>

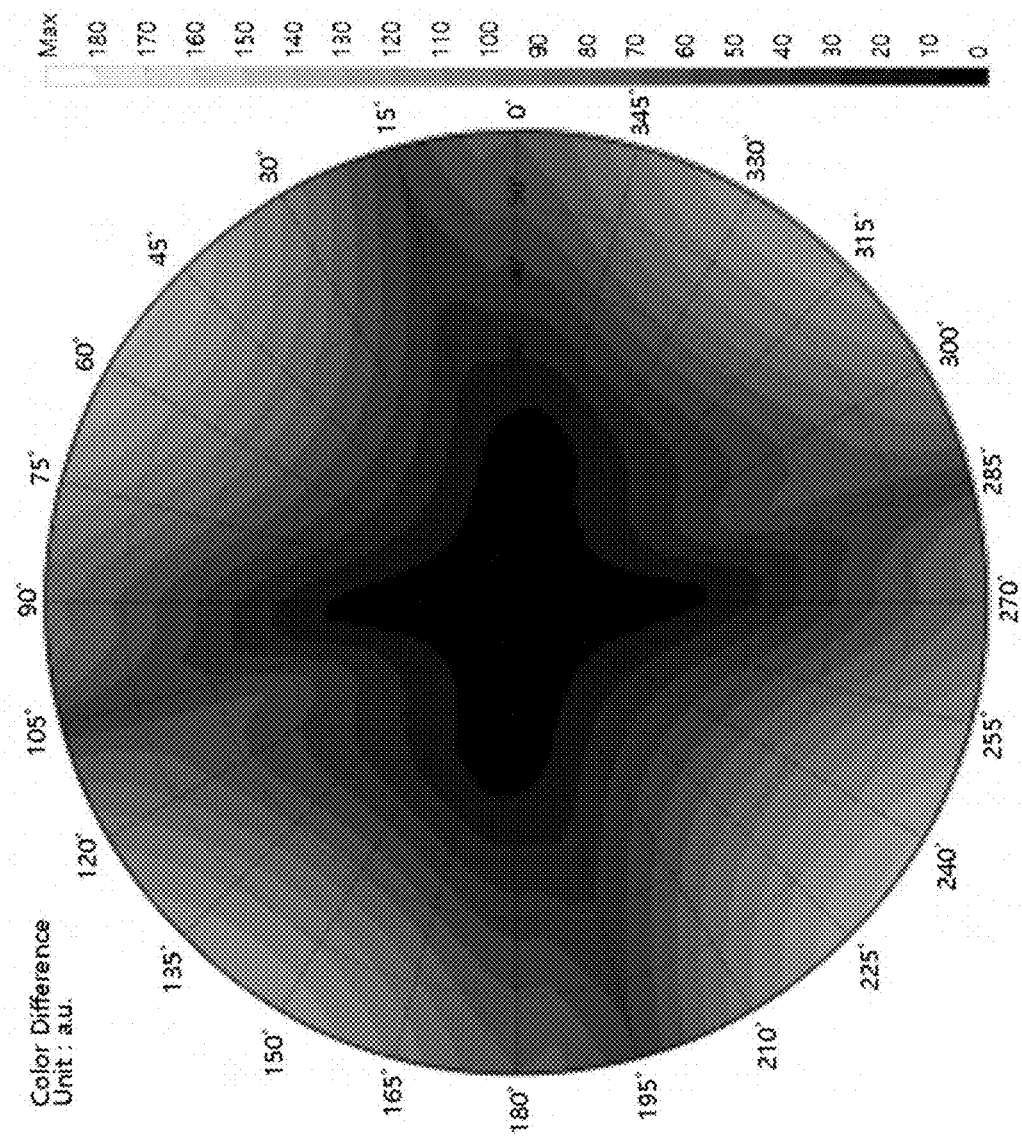
<Fig5 2-3>

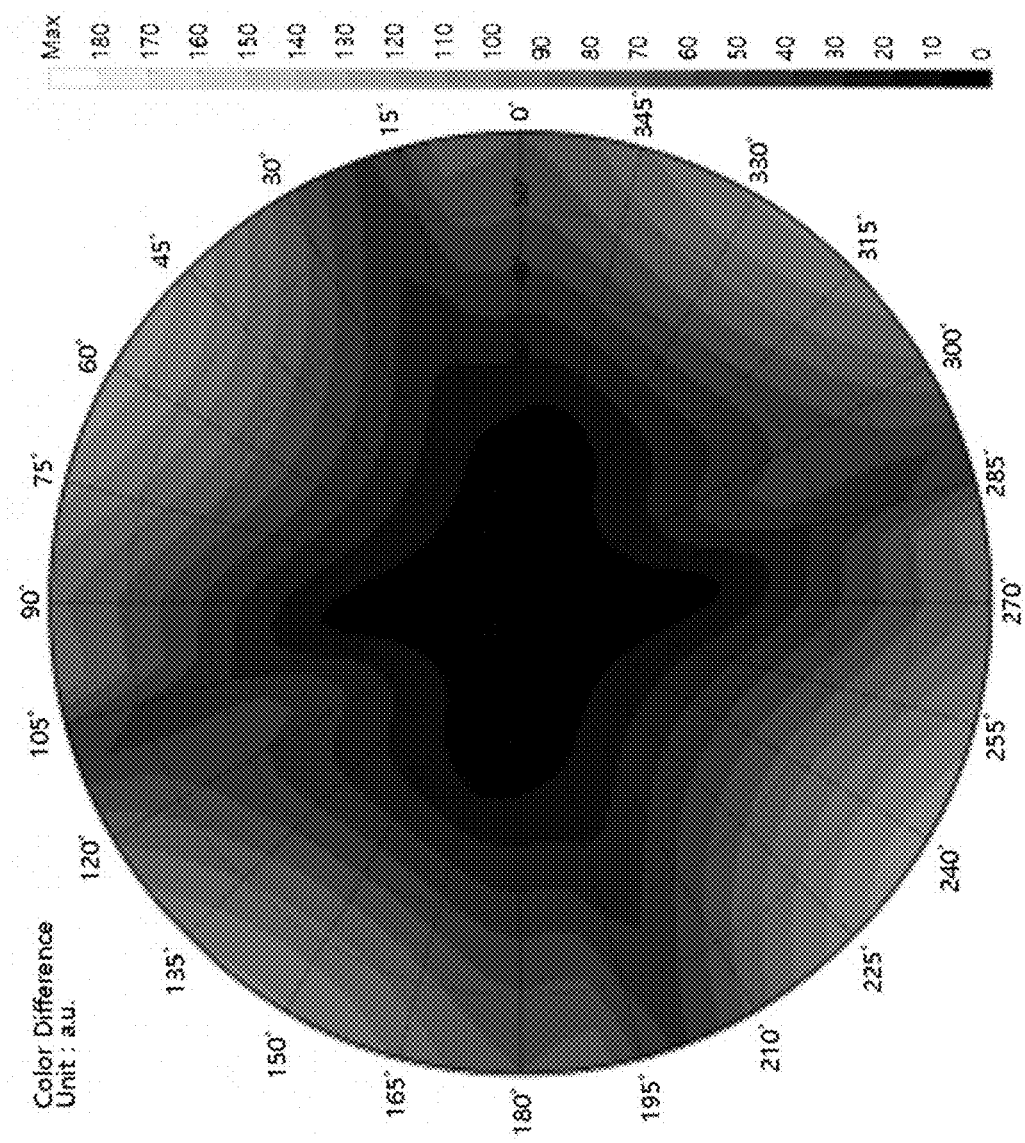
<Fig5 2-4>

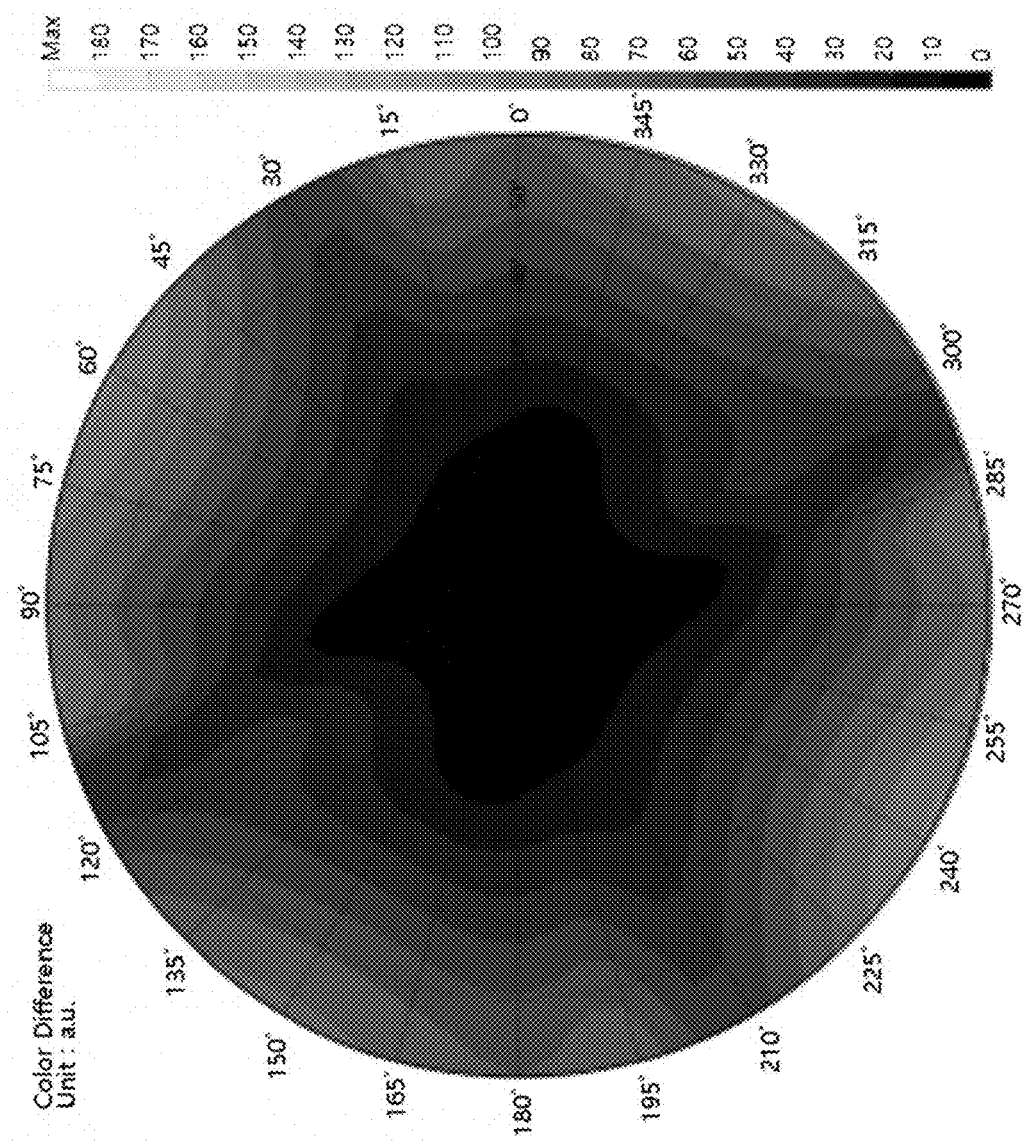
<Fig5 2-5>

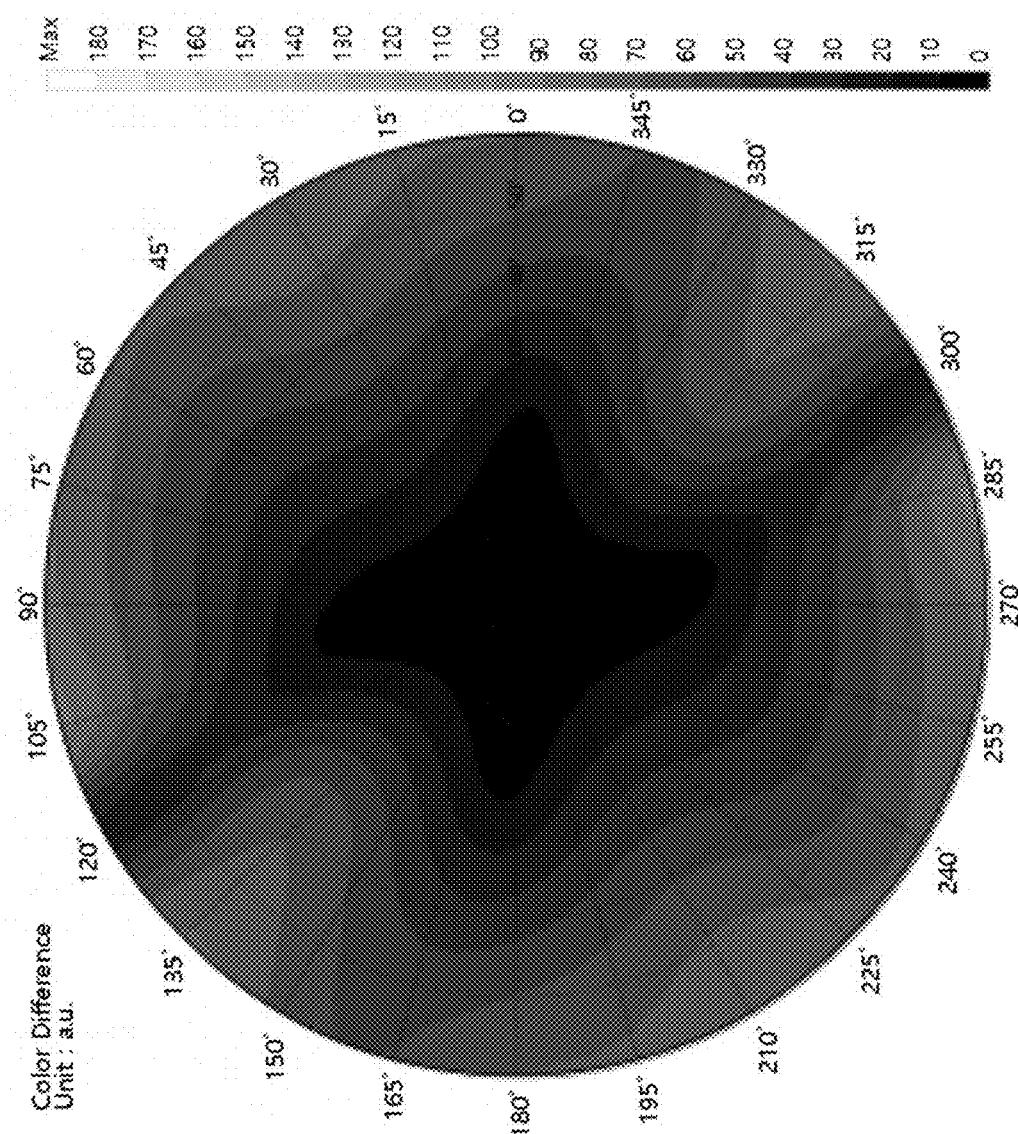
<Fig5 2-6>

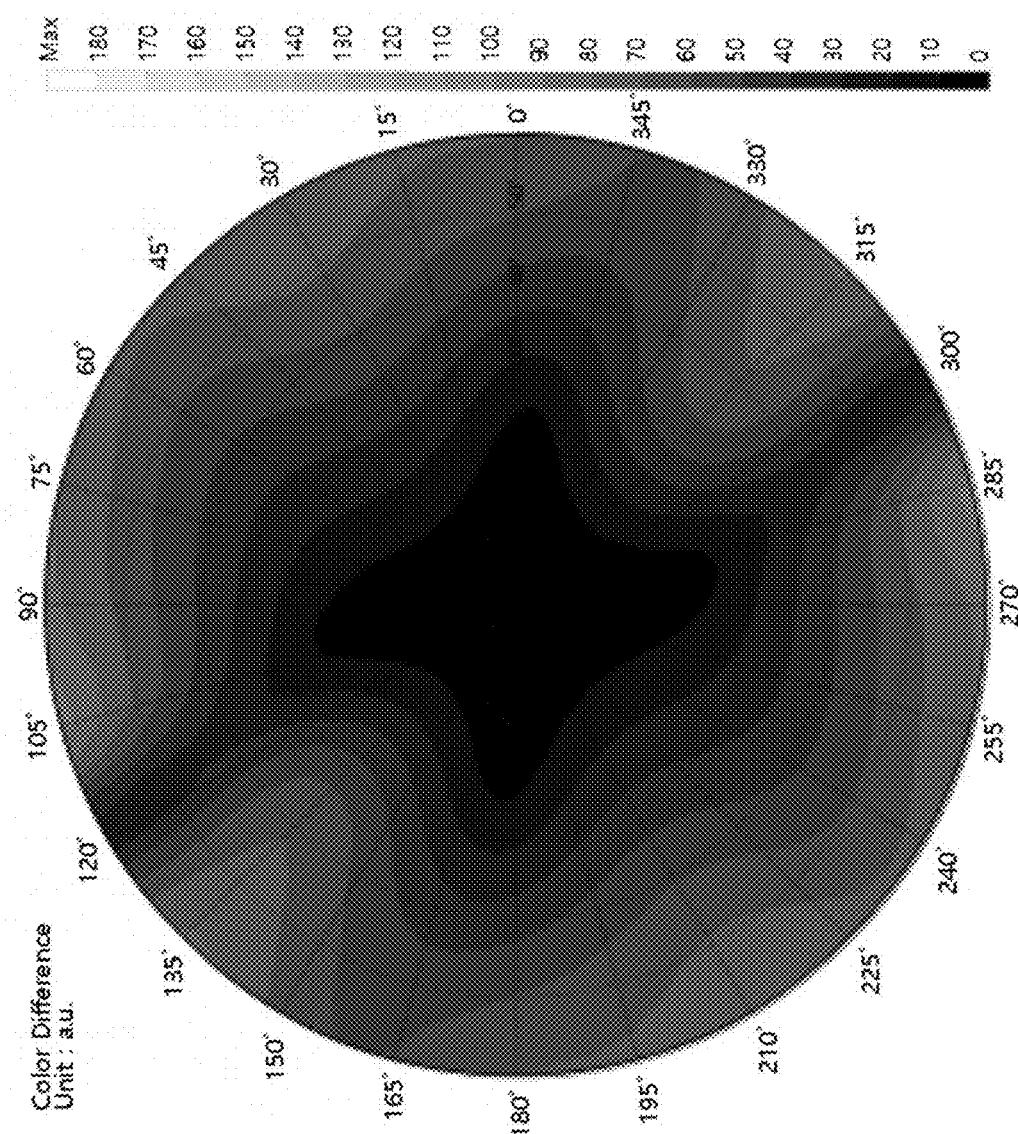
<Fig5 2-7>

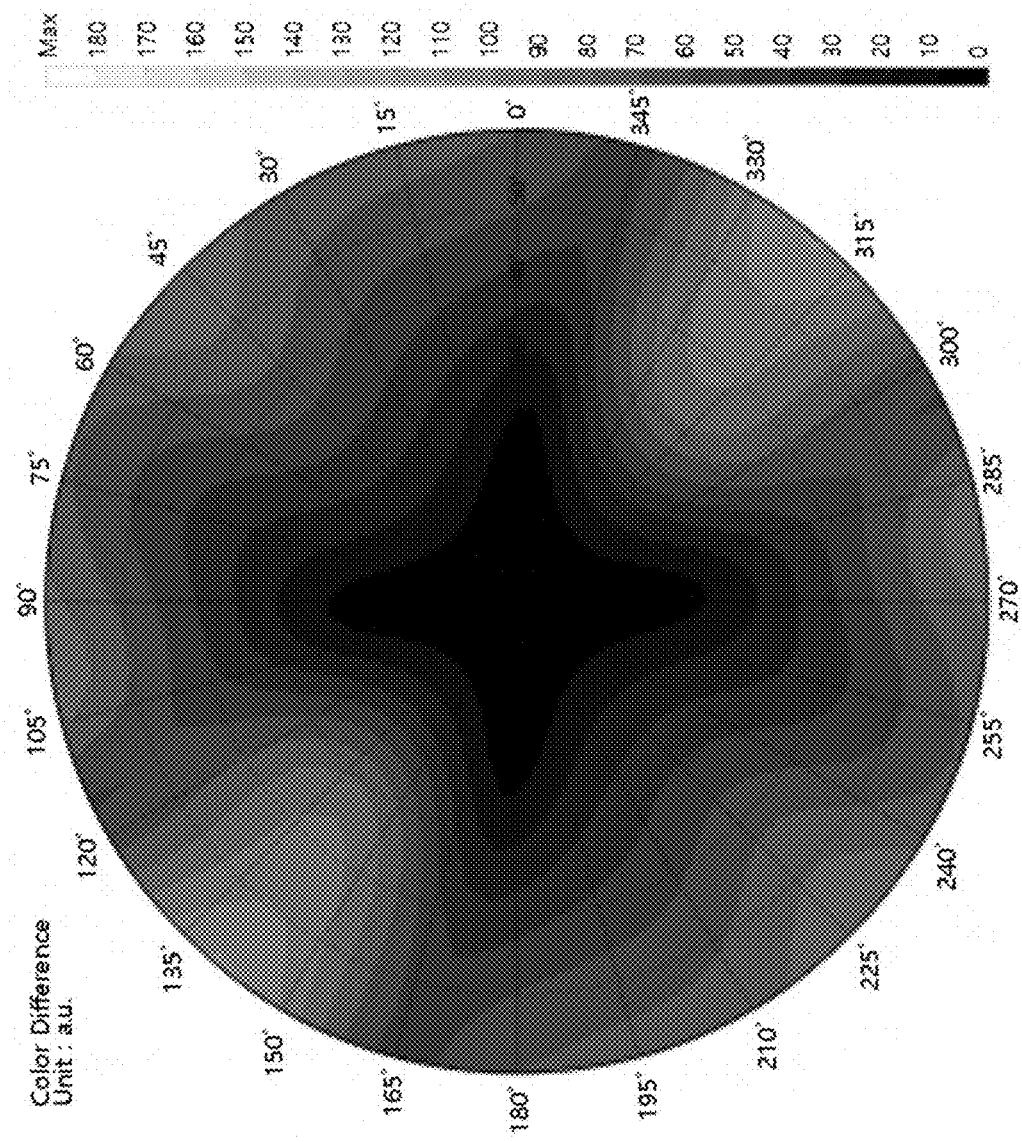
<Fig5 2-8>

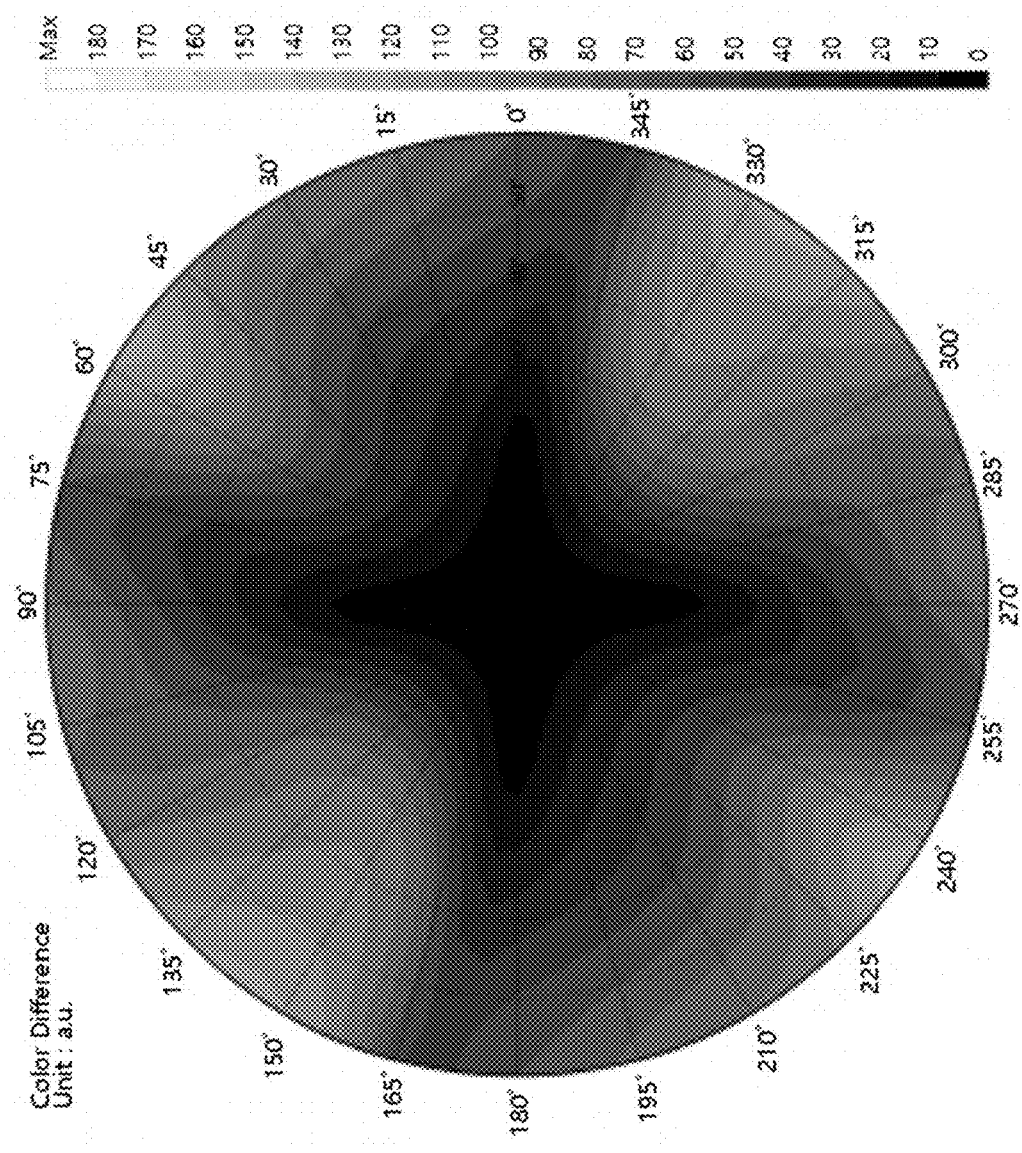
<Fig5 2-9>

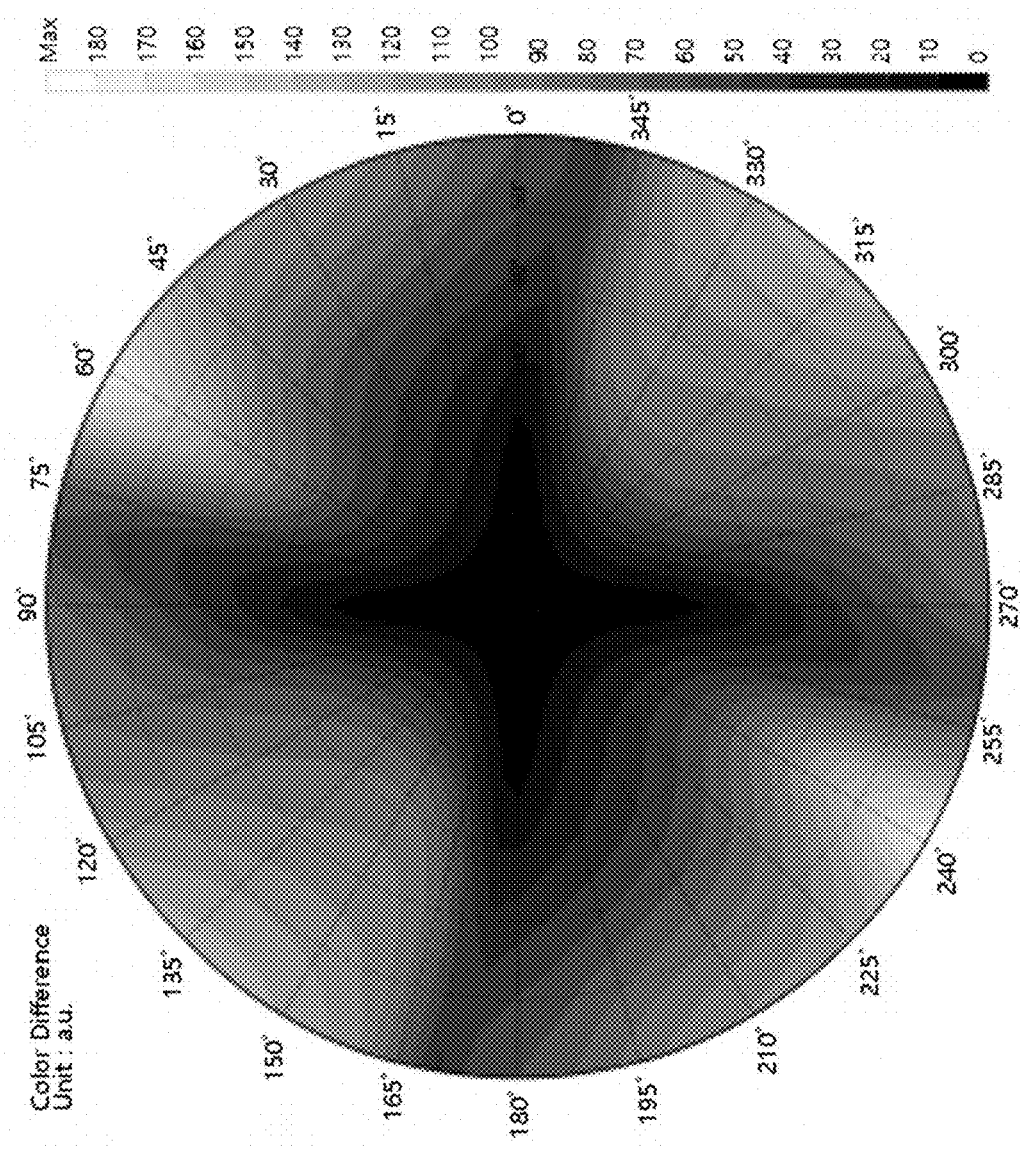
<Fig5 2-10>

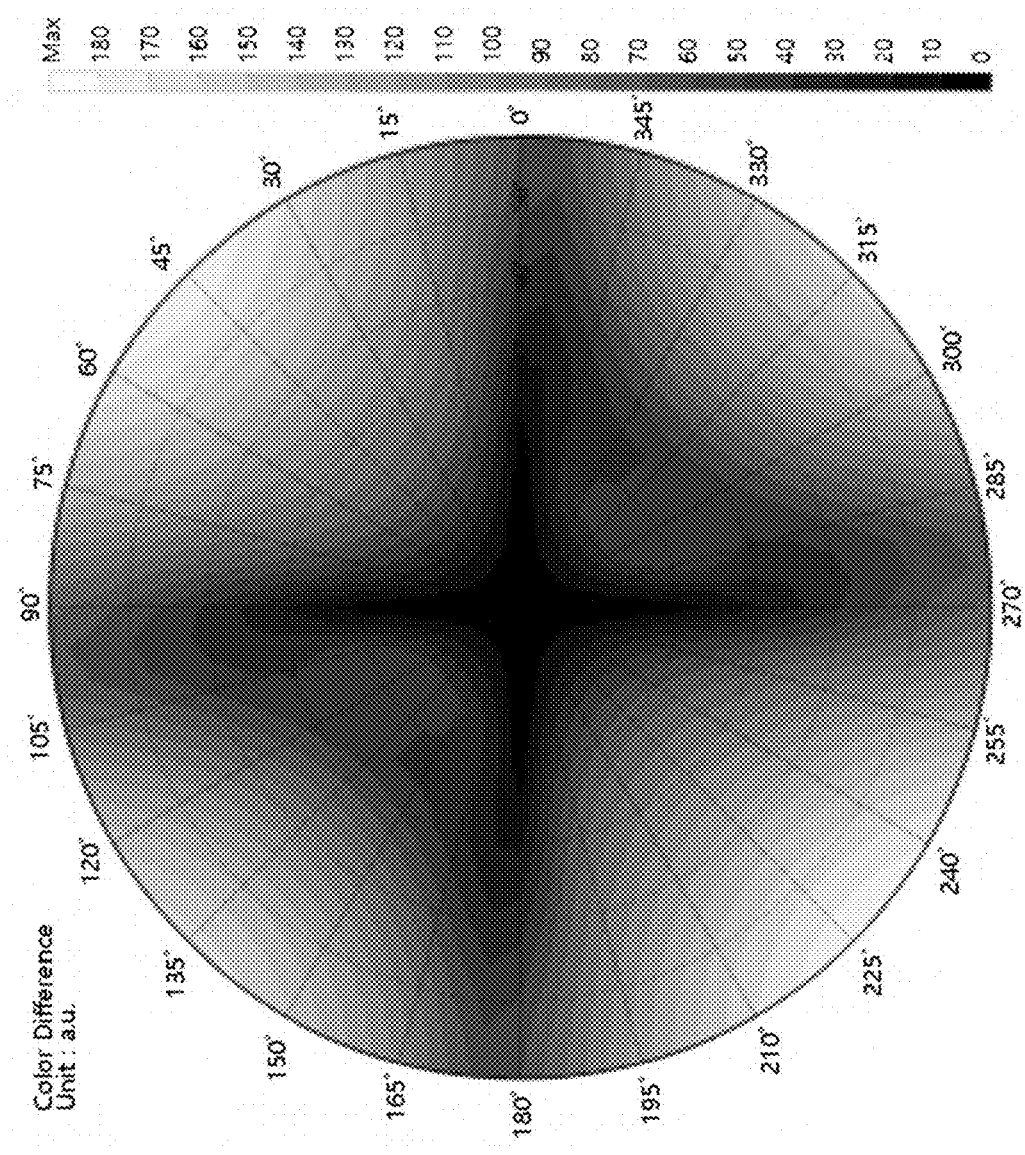
<Fig5 2-11>

OPTICAL FILTER FOR ANTI-REFLECTION AND ORGANIC LIGHT-EMITTING DEVICE

The present application is a National Phase entry pursuant to 35 U.S.C. § 371 of International Application No. PCT/KR2017/011774 filed Oct. 24, 2017, which claims priority to KR 10-2016-0138286 filed Oct. 24, 2016, the entire contents of which are incorporated herein by reference.

FIELD

This application relates to an optical filter for anti-reflection and an organic light-emitting device.

BACKGROUND

Recently, there has been a demand for weight reduction and thinning of monitors or televisions, and the like, and organic light-emitting devices (OLEDs) have been attracting attention in response to this demand. An organic light-emitting device is a self-luminescent display device emitting light by itself, which requires no separate backlight, so that the thickness can be reduced, and is advantageous to realize a flexible display device.

On the other hand, the organic light-emitting device can reflect external light by the metal electrode and the metal wiring formed on the organic light-emitting display panel, where visibility and a contrast ratio may be lowered due to the reflected external light, thereby deteriorating the display quality. A circular polarizing plate may be attached to one side of the organic light-emitting display panel, as in Patent Document 1 (Korean Laid-Open Patent Publication No. 2009-0122138), to reduce leakage of the reflected external light to the outside.

However, currently developed circular polarizing plates have strong viewing angle dependence, and thus an antireflection performance deteriorates toward the side, so that there is a problem that the visibility is lowered.

Thus, there is a problem in the art of providing an optical filter having excellent omnidirectional antireflection performance and color characteristics on the side as well as the front, and an organic light-emitting device having improved visibility by applying the optical filter.

SUMMARY

The optical filter of the present application has excellent omnidirectional antireflection performance and color characteristics on the side as well as the front, and the optical filter can be applied to an organic light-emitting device to improve visibility.

BRIEF DESCRIPTION OF THE DRAWINGS

FIG. 3 is a simulation result of color characteristics of Comparative Example 1.

FIG. 4 is a simulation result of color characteristics of Example 1.

FIG. 5 is a simulation result of color characteristics of Example 2.

DETAILED DESCRIPTION

Figures 1, 2:
FIG. 1 is an exemplary cross-sectional diagram of an optical filter according to one example of the present application
FIG. 2 is a cross-sectional diagram of an organic light-emitting device according to one example of the present application.

The present application relates to an optical filter for anti-reflection. FIG. 1 illustratively shows the optical filter. As shown in FIG. 1, the optical filter may comprise a polarizer (40), a first retardation film (10) and a second retardation film (20) sequentially, and comprise an optical compensation layer (30) between the polarizer and the first retardation film.

The polarizer may have an absorption axis formed in one direction. The first retardation film may have reverse wavelength dispersion characteristics and quarter-wave phase retardation characteristics. The second retardation film can satisfy Equation 1 to be described below. The optical compensation layer may comprise a third retardation film satisfying an Nz value to be described below.

In this specification, the polarizer means an element exhibiting selective transmission and absorption characteristics with respect to incident light. For example, the polarizer can transmit light that vibrates in any one direction from incident light that vibrates in various directions, and absorb light that vibrates in the other directions.

The polarizer included in the optical filter may be a linear polarizer. In this specification, the linear polarizer means a case where the selectively transmitting light is a linearly polarized light that vibrates in any one direction and the selectively absorbing light is a linearly polarized light that vibrates in a direction orthogonal to the vibration direction of the linearly polarized light.

As the linear polarizer, for example, a polarizer in which iodine is dyed on a polymer stretched film such as a PVA stretched film may be used. Alternatively, a guest-host polarizer in which a liquid crystal polymerized in an oriented state is used as a host and an anisotropic dye arranged depending on the orientation of the liquid crystal is used as a guest may be used, without being limited thereto.

According to one example of the present application, a PVA stretched film can be used as the polarizer. The transmittance or polarization degree of the polarizer can be appropriately adjusted in consideration of the object of the present application. For example, the transmittance of the polarizer may be from 42.5% to 55%, and the polarization degree may be from 65% to 99.9997%.

In this specification, when the term such as vertical, horizontal, orthogonal or parallel is used while defining an angle, it means substantially vertical, horizontal, orthogonal, or parallel to the extent that the desired effect is not impaired, which includes, for example, an error that takes a production error or a deviation (variation), and the like, into account. For example, each case of the foregoing may include an error within about ±15 degrees, an error within about ±10 degrees or an error within about ±5 degrees.

In this specification, the retardation film is an optically anisotropic element, which may mean an element capable of converting incident polarized light by controlling birefringence. While describing an x-axis, y-axis and z-axis of the retardation film herein, unless otherwise specified, the x-axis means a direction parallel to an in-plane slow axis of the retardation film, the y-axis means a direction parallel to an in-plane fast axis of the retardation film, and the z-axis means a thickness direction of the retardation film. The x-axis and y-axis may be orthogonal to each other in the plane. While describing an optical axis of the retardation film herein, unless otherwise specified, it means a slow axis. When the retardation film comprises rod-shaped liquid crystal molecules, the slow axis may mean the long axis direction of the rod shape, and when it comprises disk-shaped liquid crystal molecules, the slow axis may mean the normal direction of the disk shape.

In this specification, the retardation film satisfying Equation 1 below can be called a so-called +C plate.

In this specification, the retardation film satisfying Equation 2 below can be called a so-called +B plate.

In this specification, the retardation film satisfying Equation 3 below can be called a so-called −B plate.

In this specification, the retardation film satisfying Equation 4 below can be called a so-called +A plate.

In this specification, the retardation film satisfying Equation 5 below can be called a so-called −A plate.

$$nx=ny<nz \quad \text{[Equation 1]}$$

$$ny<nx \neq nz \quad \text{[Equation 2]}$$

$$nx>ny>nz \quad \text{[Equation 3]}$$

$$nx>ny=nz \quad \text{[Equation 4]}$$

$$nx=nz>ny \quad \text{[Equation 5]}$$

In Equations 1, 2, 3, 4 and 5, nx, ny and nz are refractive indexes in the x-axis, y-axis and z-axis directions defined above, respectively.

In this specification, the in-plane retardation (Rin) of the retardation film is calculated by Equation 6 below.

In this specification, the thickness-direction retardation (Rth) of the retardation film is calculated by Equation 7 below.

In this specification, the Nz value of the retardation film is calculated by Equation 8 below.

$$Rin=d \times (nx-ny) \quad \text{[Equation 6]}$$

$$Rth=d \times \{(nz-(nx-ny)/2\} \quad \text{[Equation 7]}$$

$$Nz=(nx-nz)/(nx-ny) \quad \text{[Equation 8]}$$

In Equations 6, 7 and 8, Rin is an in-plane retardation, Rth is a thickness-direction retardation, d is a thickness of the retardation film, and nx, ny and nz are refractive indexes in the x-axis, y-axis and z-axis directions defined above, respectively.

In this specification, the reverse wavelength dispersion characteristic may mean a characteristic satisfying Equation 9 below, the normal wavelength dispersion characteristic may mean a characteristic satisfying Equation 10 below, and the flat wavelength dispersion characteristic may mean a characteristic satisfying Equation 11 below.

$$R(450)/R(550)<R(650)/R(550) \quad \text{[Equation 9]}$$

$$R(450)/R(550)>R(650)/R(550 \quad \text{[Equation 10]}$$

$$R(450)/R(550)=R(650)/R(550) \quad \text{[Equation 11]}$$

While describing the refractive index of the retardation film herein, unless otherwise specified, it means a refractive index for light of a wavelength of about 550 nm.

The first retardation film may be a +B plate satisfying Equation 2 above, a −B plate satisfying Equation 3 above, or a +A plate satisfying Equation 4 above.

The first retardation film may have a quarter-wave phase retardation characteristic. In this specification, the term "n-wave phase retardation characteristic" may mean a characteristic that the incident light may be phase-delayed by n times the wavelength of the incident light within at least a part of the wavelength range. Therefore, the quarter-wave phase retardation characteristic may mean a characteristic that the incident light may be phase-delayed by a quarter times the wavelength of the incident light within at least a part of the wavelength range.

The in-plane retardation of the first retardation film for light having a wavelength of 550 nm may be 120 nm to 160 nm, specifically 130 nm to 150 nm. When the in-plane retardation of the first retardation film satisfies the above range, it may be advantageously exhibit excellent omnidirectional antireflection performance and color characteristics on the side as well as the front.

The thickness-direction retardation of the first retardation film for light having a wavelength of 550 nm may be 60 nm to 120 nm, specifically, 80 nm to 100 nm. When the thickness-direction retardation of the first retardation film satisfies the above range, it may advantageously exhibit excellent omnidirectional antireflection performance and color characteristics on the side as well as the front.

In one example, the sum of thickness-direction retardations of the first retardation film, the second retardation film and the third retardation film may be 150 nm to 250 nm, specifically 170 nm to 210 nm. When the sum of the thickness-direction retardations satisfies the above range, it may advantageously exhibit excellent omnidirectional antireflection performance and color characteristics on the side as well as the front.

The first retardation film may have reverse wavelength dispersion characteristics. For example, the first retardation film may have a property that the in-plane retardation increases, as the wavelength of incident light increases. The wavelength of the incident light may be, for example, 300 nm to 800 nm.

The R (450)/R (550) value of the first retardation film may be in the range of 0.60 to 0.99 or 0.80 to 0.99, specifically, 0.80 to 0.92, or 0.60 to 0.92. The value of R (650)/R (550) of the first retardation film has a value larger than the value of the R (450)/R (550), which may be 1.01 to 1.19, 1.05 to 1.15, or 1.09 to 1.11. When the first retardation film has the reverse wavelength dispersion characteristic, it may be advantageous to exhibit excellent omnidirectional antireflection performance and color characteristics on the side as well as the front.

The in-plane slow axis of the first retardation film may form about 40 degrees to 50 degrees, about 43 degrees to 47 degrees, specifically about 45 degrees with the absorption axis of the polarizer.

The second retardation film may be a +C plate satisfying Equation 1 above. The second retardation film may have a thickness-direction retardation of more than 0. Specifically, the thickness-direction retardation of the second retardation film may be 70 nm to 160 nm.

The second retardation film may have reverse wavelength dispersion characteristics, normal wavelength dispersion characteristics, or flat wavelength dispersion characteristics.

The third retardation film may have an Nz value of 1.2 or less. The third retardation film may be a +B plate satisfying Equation 2 above, a −B plate satisfying Equation 3 above, a +A plate satisfying the Equation 4, or a −A plate satisfying Equation 5 above. When the third retardation film is a +B plate, particularly when it satisfies nz>nx>ny, the Nz value may be a negative number of less than 0, and particularly, when it satisfies nx>nz>ny, the Nz value may be more than 0 and less than 1. If the third retardation film is a −B plate, the Nz value may be more than one. When the third retardation film is a +A plate, the Nz value may be 1. When the third retardation film is a −A plate, the Nz value may be 0.

In one example, the Nz value of the third retardation film may be −1.2 to 1.2. The Nz value of the third retardation film may be specifically from −1 to 1, and may be from −0.2 to 0.8. When the Nz value of the third retardation film satisfies the above range, it may advantageously exhibit excellent omnidirectional antireflection performance and color characteristics on the side as well as the front.

The in-plane retardation of the third retardation film may be 70 nm to 200 nm.

The in-plane slow axis of the third retardation film may be parallel or orthogonal to the absorption axis of the polarizer.

The third retardation film may have reverse wavelength dispersion characteristics, normal wavelength dispersion characteristics, or flat wavelength dispersion characteristics. According to one embodiment of the present application, the third retardation film may have normal wavelength dispersion characteristics. The R (450)/R (550) of the third retardation film may be, for example, 1.05 to 1.15.

By adjusting the optical properties of the third to the second retardation films according to whether the in-plane slow axis of the third retardation film is orthogonal or parallel to the absorption axis of the polarizer, the optical filter of the present application can effectively improve omnidirectional antireflection performance and color characteristics on the side as well as on the front.

In one example, the in-plane slow axis of the third retardation film may be parallel to the absorption axis of the polarizer. Here, the in-plane retardation of the third retardation film may be 70 nm to 180 nm. Here, the Nz value of the third retardation film may be −0.2 to 0.8, 0 to 0.8, 0 to 0.6, 0 to 0.2 or 0.4 to 0.6. In this case, the thickness-direction retardation of the second retardation film may be 70 nm to 120 nm.

In one example, the in-plane slow axis of the third retardation film may be orthogonal to the absorption axis of the polarizer. The in-plane retardation of the third retardation film may be 100 nm to 200 nm. Here, the Nz value of the third retardation film may be −0.4 to 0.6, −0.4 to 0.4, −0.2 to 0.4, −0.2 to 0.2, or 0 to 0.2. In this case, the thickness-direction retardation of the second retardation film may be 100 nm to 160 nm.

The first and second to third retardation films may each be a polymer film or a liquid crystal film. As the polymer film, a film comprising polyolefin such as PC (polycarbonate), norbonene resin, PVA (poly(vinyl alcohol)), PS (polystyrene), PMMA (poly(methyl methacrylate) and PP (polypropylene), Par (poly(arylate)), PA (polyamide), PET (poly (ethylene terephthalate)) or PS (polysulfone), and the like, can be used. The polymer film may be stretched or shrunk under appropriate conditions to impart birefringence and used as the first and second retardation films. The liquid crystal film may comprise liquid crystal molecules in a state of being oriented and polymerized. The liquid crystal molecule may be a polymerizable liquid crystal molecule. In this specification, the polymerizable liquid crystal molecule may mean a molecule containing a moiety capable of exhibiting liquid crystallinity, such as a mesogen skeleton, and containing at least one polymerizable functional group. Also, polymerizable liquid crystal molecules in a polymerized form may mean a state in which the liquid crystal molecules are polymerized to form a skeleton such as a main chain or side chain of the liquid crystal polymer in the liquid crystal film.

The thickness of the first retardation film may be 1.0 µm to 5.0 µm or 1.25 µm to 3.0 µm. The thickness of the second retardation film may be 1.1 µm to 5.5 µm or 1.2 µm to 3.0 µm. The thickness of the third retardation film may be 1.1 µm to 6.7 µm, or 1.1 µm to 3.5 µm.

The optical filter may further comprise a surface treatment layer. The surface treatment layer may be exemplified by an antireflection layer or the like. The surface treatment layer may be disposed on the outer side of the polarizer, that is, on the opposite side where the second retardation film is disposed. As the antireflection layer, a laminate of two or more layers having different refractive indexes or the like may be used, without being limited thereto.

The first retardation film, the second retardation film, and the third retardation film or the polarizer of the optical filter may be attached to each other through a pressure-sensitive adhesive or an adhesive, or may be laminated to each other by direct coating. An optical transparent pressure-sensitive adhesive or adhesive may be used as the pressure-sensitive adhesive or adhesive.

For example, the optical filter may have a reflectance measured at a tilt angle of 60 degrees of 14.5% or less, 14% or less, 13% or less, 12% or less, 11% or less, or 10% or less. The reflectance may be a reflectance for light of any wavelength in the visible light region, for example, a reflectance for light of any wavelength in a range of 380 nm to 780 nm, or a reflectance for light belonging to the entire visible light region. The reflectance may be, for example, the reflectance measured on the polarizer side of the optical filter. The reflectance may be a reflectance measured at a specific azimuth angle or a predetermined range of azimuth angles of a tilt angle of 60 degrees or a reflectance measured for the entire azimuth angle at a tilt angle of 60 degrees or an average reflectance measured for the entire azimuth angle at a tilt angle of 60 degrees, which is a value measured in examples to be described below.

The optical filter may have an average of color difference of less than 70, 60 or less, 50 or less, 40 or less, 30 or less, 25 or less, 20 or less, or 15 or less. In this specification, the color difference means how the side color differs from the front color when the optical filter has been applied to the organic light-emitting display panel, which may mean a value calculated by an equation of $\Delta E^*_{ab}$, in color characteristic simulation evaluation of examples to be described below.

The optical filter of the present application can prevent the reflection of external light, thereby improving the visibility of the organic light-emitting device. While incident unpolarized light (hereinafter referred to as "external light") incident from the outside passes through a polarizer, one polarized orthogonal component, that is, a first polarized orthogonal component, of two polarized orthogonal components may be only transmitted and the polarized light may be changed to circularly polarized light while passing through the first retardation film. While the circularly polarized light is reflected from a display panel of an organic light-emitting display device comprising a substrate, an electrode, and the like, the rotational direction of the circularly polarized light is changed and the circularly polarized light is converted to the other polarized orthogonal component of two polarized orthogonal components, that is, a second polarized orthogonal component while passing through the first retardation film again. The second polarized orthogonal component does not pass through the polarizer and thus does not emit light to the outside, so that it can have an effect of preventing reflection of external light.

The optical filter of the present application can also effectively prevent the reflection of external light incident from the side, thereby improving the lateral visibility of the organic light-emitting device. For example, it is also possible to effectively prevent the reflection of external light incident from the side through viewing angle polarization compensation principle.

The optical filter of the present application can be applied to an organic light-emitting device. FIG. 2 is a cross-sectional diagram exemplarily showing an organic light-emitting device. Referring to FIG. 2, the organic light-emitting device comprises an organic light-emitting display panel (200) and an optical filter (100) positioned on one side of the organic light-emitting display panel (200). The first retardation film (10) of the optical filter may be disposed adjacent to the organic light-emitting display panel (200) as compared with the polarizer (40).

The organic light-emitting display panel may comprise a base substrate, a lower electrode, an organic light-emitting layer, an upper electrode and a sealing substrate, and the like. One of the lower electrode and the upper electrode may be an anode and the other may be a cathode. The anode is an electrode into which holes are injected, which may be made of a conductive material having a high work function. The cathode is an electrode into which electrons are injected, which may be made of a conductive material having a low work function. At least one of the lower electrode and the upper electrode may be made of a transparent conductive material that the emitted light can come out to the outside, and may be, for example, ITO or IZO. The organic light-emitting layer may comprise an organic material capable of emitting light when a voltage has been applied to the lower electrode and the upper electrode.

Additional layers may be further included between the lower electrode and the organic light-emitting layer and between the upper electrode and the organic light-emitting layer. The additional layer may include a hole transporting layer, a hole injecting layer, an electron injecting layer and an electron transporting layer for balancing electrons and holes, but is not limited thereto. The sealing substrate may be made of glass, metal, and/or a polymer, and may seal the lower electrode, the organic light-emitting layer, and the upper electrode to prevent moisture and/or oxygen from being introduced from the outside.

The optical filter (100) may be disposed on the side where the light comes out from the organic light-emitting display panel. For example, in the case of a bottom emission structure in which light is emitted toward the base substrate, it may be disposed outside the base substrate, and in the case of a top emission structure in which light is emitted toward the sealing substrate, it may be disposed outside the sealing substrate. The optical filter (100) can improve display characteristics of the organic light-emitting device by preventing external light from being reflected by the reflective layer made of metal such as electrodes and wiring of the organic light-emitting display panel (200) and from coming out of the organic light-emitting device. In addition, since the optical filter (100) can exhibit an antireflection effect on the side as well as the front, as described above, the lateral visibility can be improved.

Hereinafter, the contents will be described in more detail through Examples and Comparative Examples, but the scope of the present application is not limited to the following contents.

Examples 1 and 2 and Comparative Example 1

For evaluation of reflectance and color characteristic simulation, a structure in which a polarizer, a retardation film, and an OLED panel were sequentially disposed was set. The polarizer has an absorption axis in one direction and a single transmittance (Ts) of 42.5%, and the OLED panel is Galaxy S6. R (450)/R (550) of the first retardation film is commonly 0.84.

Comparative Example 1 is a structure in which a polarizer (0 degrees), a first retardation film (45 degrees) and an OLED panel are sequentially arranged.

Example 1 is a structure in which a polarizer (0 degrees), a third retardation film (0 degrees), a first retardation film (45 degree), a second retardation film, and an OLED panel are sequentially arranged.

Example 2 is a structure in which a polarizer (0 degrees), a third retardation film (90 degrees), a first retardation film (45 degree), a second retardation film, and an OLED panel are sequentially arranged.

The angle of the parentheses means the direction of the light absorption axis of the polarizer or the in-plane slow axis of the retardation film.

The optical physical properties of the retardation films of Examples 1 and 2 and Comparative Example 1 were summarized in Tables 1 to 3, and for Examples 1 and 2, reflectance and color characteristics were evaluated while changing Nz values.

Evaluation Example 1 Evaluation of Reflectance Simulation

For Examples 1 and 2 and Comparative Example 1, the reflectance was simulated (Techwiz 1D plus, SANAYI System Co., Ltd.) in the side direction of 60 degrees based on the front according to the azimuth angles of 0 to 360 degrees and the results were summarized in Tables 1 to 3. The reflectance means an average reflectance for a wavelength of 380 nm to 780 nm. In Tables 1 to 3, the maximum reflectance means the highest reflectance of the reflectance at azimuth angles of 0 degrees to 360 degrees. It can be confirmed that the structures of Examples 1 and 2 are superior in the antireflection effect because the maximum reflectance is lower than that of the structure of Comparative Example 1.

Evaluation Example 2 Evaluation of Color Characteristic Simulation

For Examples 1 and 2 and Comparative Example 1, the omnidirectional color characteristics (Techwiz 1D plus, SANAYI System Co., Ltd.) were simulated, and the results were depicted in FIGS. 3 to 5 and summarized in Tables 1 to 3.

In the case of color characteristics, it is appropriate to analyze except the surface reflection influence, so that they have been calculated and evaluated by Extended Jones method. The brightness of each circle in FIGS. 3 to 5 means a color difference ($\Delta E^*_{ab}$), and the closer the color is to black, the lower the color difference means. The color difference is defined by the following equation.

$$\Delta E_{ab}^* = \sqrt{(L_1^* - L_2^*)^2 + (a_1^* - a_2^*)^2 + (b_1^* - b_2^*)^2}$$

In Equation above, ($L^*_1$, $a^*_1$, $b^*_1$) mean reflected color values at the front (tilt angle 0°, azimuth 0°) and ($L^*_2$, $a^*_2$, $b^*_2$) mean reflected color values at a position for each tilt angle and azimuth. FIGS. 3 to 5 are graphs illustrated by calculating the color difference for the omnidirectional angle. What the color difference figures mean represents how much the side color differs from the front color. Therefore, as the colors in FIGS. 3 to 5 become darker, it can be a measure capable of determining that uniform colors are realized in all directions.

The displayed color represents a color sense that a person can actually perceive. The center of the circle means the front (tilt angle 0°, azimuth 0°) and the tilt angle increases up to 60° as the distance from the circle increases. Each means an azimuth such as 90°, 180° and 270° in the counterclockwise direction from the right side (0°) along the diameter direction of the circle.

In Tables 1 to 3, the maximum color difference means the highest color difference in the reflectance at azimuth angles of 0 degrees to 360 degrees, and the average color difference means an average value of the color difference at azimuth angles of 0 degrees to 360 degrees. As shown in FIGS. 3 to 5, the colors in Examples 1 and 2 are darker than the color in Comparative Example 1 and as shown in Tables 1 to 3, their maximum color difference and average color difference are low, and thus it can be confirmed that they realize uniform colors.

The invention claimed is:

1. An optical filter for anti-reflection comprising:
   a polarizer having an absorption axis formed in one direction,
   a first retardation film having reverse wavelength dispersion characteristics and quarter-wave phase retardation characteristics,
   a second retardation film satisfying Equation 1, sequentially, and
   further comprising an optical compensation layer between the polarizer and the first retardation film, wherein the optical compensation layer comprises a third retardation film having an in-plane slow axis that is parallel or orthogonal to the absorption axis of the polarizer, and having an Nz value for light of a wavelength of about 550 nm of 1.2 to 1.2 in Equation 8:

$$nx=ny<nz \quad \text{Equation 1:}$$

$$Nz=(nx-nz)/(nx-ny) \quad \text{Equation 8:}$$

TABLE 1

| Example | First retardation film | | Second retardation film | | Third retardation film | | | Maximum reflectance (%) | Color difference | |
|---|---|---|---|---|---|---|---|---|---|---|
| | Rin (nm) | Rth (nm) | Rin (nm) | Rth (nm) | Rin (nm) | Nz | Dispersability | (60° side) | Ave. | Max. |
| 1-1 | 140 | −90 | 0 | 90 | 130 | −1.0 | 1.1 | 14.1 | 54.9 | 170.8 |
| 1-2 | 140 | −90 | 0 | 90 | 130 | −0.8 | 1.1 | 13.1 | 50.5 | 159.1 |
| 1-3 | 140 | −90 | 0 | 90 | 130 | −0.6 | 1.1 | 12.1 | 45.8 | 146.3 |
| 1-4 | 140 | −90 | 0 | 90 | 130 | −0.4 | 1.1 | 11.2 | 40.7 | 132.4 |
| 1-5 | 140 | −90 | 0 | 90 | 130 | −0.2 | 1.1 | 10.5 | 35.2 | 117.2 |
| 1-6 | 140 | −90 | 0 | 90 | 130 | 0 | 1.1 | 9.4 | 22.2 | 81.5 |
| 1-7 | 140 | −90 | 0 | 90 | 130 | 0.2 | 1.1 | 9.4 | 22.2 | 81.5 |
| 1-8 | 140 | −90 | 0 | 90 | 130 | 0.4 | 1.1 | 9.3 | 14.4 | 62.3 |
| 1-9 | 140 | −90 | 0 | 90 | 130 | 0.6 | 1.1 | 9.3 | 18.4 | 67.6 |
| 1-10 | 140 | −90 | 0 | 90 | 130 | 0.8 | 1.1 | 9.7 | 30.1 | 97.4 |
| 1-11 | 140 | −90 | 0 | 90 | 130 | 1.0 | 1.1 | 10.4 | 39.4 | 118.2 |

TABLE 2

| Example | First retardation film | | Second retardation film | | Third retardation film | | | Maximum reflectance (%) | Color difference | |
|---|---|---|---|---|---|---|---|---|---|---|
| | Rin (nm) | Rth (nm) | Rin (nm) | Rth (nm) | Rin (nm) | Nz | Dispersability | (60° side) | Ave. | Max. |
| 2-1 | 140 | −90 | 0 | 140 | 150 | −1.0 | 1.1 | 13.6% | 49.2 | 152.4 |
| 2-2 | 140 | −90 | 0 | 140 | 150 | −0.8 | 1.1 | 12.7% | 43.8 | 138.3 |
| 2-3 | 140 | −90 | 0 | 140 | 150 | −0.6 | 1.1 | 11.8% | 37.9 | 123.3 |
| 2-4 | 140 | −90 | 0 | 140 | 150 | −0.4 | 1.1 | 11.1% | 32.1 | 107.5 |
| 2-5 | 140 | −90 | 0 | 140 | 150 | −0.2 | 1.1 | 10.5% | 27.3 | 92.2 |
| 2-6 | 140 | −90 | 0 | 140 | 150 | 0 | 1.1 | 10.0% | 28.3 | 84.9 |
| 2-7 | 140 | −90 | 0 | 140 | 150 | 0.2 | 1.1 | 10.0% | 28.3 | 84.9 |
| 2-8 | 140 | −90 | 0 | 140 | 150 | 0.4 | 1.1 | 10.2% | 34.2 | 101.7 |
| 2-9 | 140 | −90 | 0 | 140 | 150 | 0.6 | 1.1 | 10.6% | 40.9 | 118.9 |
| 2-10 | 140 | −90 | 0 | 140 | 150 | 0.8 | 1.1 | 11.3% | 48.1 | 169.4 |
| 2-11 | 140 | −90 | 0 | 140 | 150 | 1.0 | 1.1 | 14.6% | 60.5 | 178.9 |

TABLE 3

| Comparative Example | First retardation film | | Maximum reflectance (%) | Color difference | |
|---|---|---|---|---|---|
| | Rin (nm) | Rth (nm) | (60° side) | Ave. | Max. |
| 1 | 140 | −90 | 14.7% | 70.2 | 176.5 |

EXPLANATION OF REFERENCE NUMERALS

10: first retardation film; 20: second retardation film; 30: third retardation film; 40: polarizer; 100: optical filter; 200: organic light-emitting display panel.

wherein, nx, ny, and nz are refractive indexes in the x-axis, y-axis and z-axis directions of the retardation film, the x-axis is a direction parallel to the in-plane slow axis of the retardation film, the y-axis is a direction parallel to an in-plane fast axis of the retardation film, and the z-axis is a thickness direction of the retardation film.

2. The optical filter according to claim 1, wherein the first retardation film is a retardation film satisfying Equation 2, 3 or 4 below:

$$ny<nx \neq nz \quad \text{Equation 2:}$$

$$nx>ny>nz \quad \text{Equation 3:}$$

$$nx > ny = nz \qquad \text{Equation 4:}$$

wherein, nx, ny and nz are refractive indexes in the x-axis, y-axis and z-axis directions of the retardation film, the x-axis is a direction parallel to the in-plane slow axis of the retardation film, the y-axis is a direction parallel to an in-plane fast axis of the retardation film, and the z-axis is a thickness direction of the retardation film.

3. The optical filter according to claim 1, wherein the first retardation film has an in-plane retardation of 130 nm to 150 nm for light having a wavelength of 550 nm.

4. The optical filter according to claim 1, wherein the first retardation film has an R (450)/R (550) of 0.60 to 0.92, and R (λ) means an in-plane retardation of the retardation film for light of λ, nm.

5. The optical filter according to claim 1, wherein the third retardation film has an in-plane retardation for light of a wavelength of about 550 nm of 70 nm to 200 nm.

6. The optical filter according to claim 1, wherein the third retardation film has an Nz value of from −1 to 1.

7. The optical filter according to claim 1, wherein the third retardation film has an Nz value of −0.2 to 0.8.

8. The optical filter according to claim 1, wherein the third retardation film has an in-plane slow axis parallel to the absorption axis of the polarizer, an in-plane retardation for light of a wavelength of about 550 nm of 70 nm to 180 nm and an Nz value of −0.2 to 0.8, and the second retardation film has a thickness-direction retardation of 70 nm to 120 nm.

9. The optical filter according to claim 1, wherein the third retardation film has an in-plane slow axis orthogonal to the absorption axis of the polarizer, an in-plane retardation for light of a wavelength of about 550 nm of 100 nm to 200 nm and an Nz value of −0.4 to 0.6, and the second retardation film has a thickness-direction retardation of 100 nm to 160 nm.

10. An organic light-emitting device comprising the optical filter of claim 1 and an organic light-emitting display panel.

11. The organic light-emitting device according to claim 10, wherein the first retardation film of the optical filter is disposed adjacent to the organic light-emitting display panel as compared with the polarizer.

12. An optical filter for anti-reflection comprising:
a polarizer having an absorption axis formed in one direction,
a first retardation film having reverse wavelength dispersion characteristics and quarter-wave phase retardation characteristics, wherein an in-plane slow axis of the first retardation film forms 43 degrees to 47 degrees with the absorption axis of the polarizer,
a second retardation film satisfying Equation 1, sequentially, and
further comprising an optical compensation layer between the polarizer and the first retardation film, wherein the optical compensation layer comprises a third retardation film having an Nz value for light of a wavelength of about 550 nm of −1.2 to 1.2 in Equation 8:

$$nx = ny < nz \qquad \text{Equation 1:}$$

$$Nz = (nx-nz)/(nx-ny) \qquad \text{Equation 8:}$$

wherein, nx, ny, and nz are refractive indexes in the x-axis, y-axis and z-axis directions of the retardation film, the x-axis is a direction parallel to the in-plane slow axis of the retardation film, the y-axis is a direction parallel to an in-plane fast axis of the retardation film, and the z-axis is a thickness direction of the retardation film.

13. An optical filter for anti-reflection comprising:
a polarizer having an absorption axis formed in one direction,
a first retardation film having reverse wavelength dispersion characteristics and quarter-wave phase retardation characteristics,
a second retardation film satisfying Equation 1, sequentially, wherein the second retardation film has a thickness-direction retardation for light of a wavelength of about 550 nm of 70 nm to 160 nm, and
further comprising an optical compensation layer between the polarizer and the first retardation film, wherein the optical compensation layer comprises a third retardation film having an Nz value for light of a wavelength of about 550 nm of −1.2 to 1.2 in Equation 8:

$$nx = ny < nz \qquad \text{Equation 1:}$$

$$Nz = (nx-nz)/(nx-ny) \qquad \text{Equation 8:}$$

wherein, nx, ny, and nz are refractive indexes in the x-axis, y-axis and z-axis directions of the retardation film, the x-axis is a direction parallel to the in-plane slow axis of the retardation film, the y-axis is a direction parallel to an in-plane fast axis of the retardation film, and the z-axis is a thickness direction of the retardation film.

* * * * *